(12) United States Patent
Chae et al.

(10) Patent No.: US 10,616,571 B2
(45) Date of Patent: Apr. 7, 2020

(54) IMAGE SENSOR WITH TEST CIRCUIT

(71) Applicant: SAMSUNG ELECTRONICS CO., LTD., Suwon-si, Gyeonggi-do (KR)

(72) Inventors: Hee-sung Chae, Seoul (KR); Dah-som Kim, Ansan-si (KR); Yun-hong Kim, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 89 days.

(21) Appl. No.: 15/661,486

(22) Filed: Jul. 27, 2017

(65) Prior Publication Data
US 2018/0035108 A1 Feb. 1, 2018

(30) Foreign Application Priority Data

Jul. 28, 2016 (KR) .................. 10-2016-0096131

(51) Int. Cl.
*H04N 17/00* (2006.01)
*H03M 1/10* (2006.01)
*H04N 5/378* (2011.01)
*H03M 1/12* (2006.01)
*H03M 1/56* (2006.01)

(52) U.S. Cl.
CPC ........ *H04N 17/002* (2013.01); *H03M 1/1071* (2013.01); *H04N 5/378* (2013.01); *H03M 1/123* (2013.01); *H03M 1/56* (2013.01)

(58) Field of Classification Search
CPC ..... H04N 5/378; H04N 17/002; H03M 1/123; H03M 1/1071; H03M 1/108; H03M 1/56
See application file for complete search history.

(56) References Cited

U.S. PATENT DOCUMENTS

| 7,233,277 | B2 | 6/2007 | Roh |
| 8,040,414 | B2 | 10/2011 | Nakao et al. |
| 8,054,354 | B2 | 11/2011 | Taura |
| 8,735,796 | B2 | 5/2014 | Shimizu et al. |
| 9,264,703 | B2 | 2/2016 | Pahr |
| 9,294,699 | B2 | 3/2016 | Muto et al. |
| 9,294,763 | B2 | 3/2016 | Solhusvik et al. |
| 2008/0158396 | A1 | 7/2008 | Fainstain et al. |
| 2016/0028980 | A1* | 1/2016 | Kameyama ............ H04N 5/378 348/294 |
| 2018/0324416 | A1* | 11/2018 | Kim ..................... H04N 17/002 |

FOREIGN PATENT DOCUMENTS

| JP | 2008-109266 A | 5/2008 |
| KR | 10-0694464 B1 | 3/2007 |

* cited by examiner

*Primary Examiner* — Daniel M Pasiewicz
(74) *Attorney, Agent, or Firm* — Lee IP Law, P.C.

(57) ABSTRACT

An image sensor includes a pixel array, an analog-to-digital converter (ADC), and a test circuit. The pixel array includes a plurality of pixels arranged in rows and columns. Each pixel generates an analog signal based on incident light. The ADC converts the analog signal to a digital signal using a counter. The test circuit receives a test code in a test mode, generates a count clock signal based on the test code, tests a counting operation of the counter according to the count clock signal, and externally outputs a test result of the counter through a test terminal.

20 Claims, 20 Drawing Sheets

IMAGE SENSOR WITH TEST CIRCUIT

CROSS-REFERENCE TO RELATED APPLICATION

Korean Patent Application No. 10-2016-0096131, filed on Jul. 28, 2016, and entitled, "Image Sensor with Test Circuit," is incorporated by reference herein in its entirety.

BACKGROUND

1. Field

One or more embodiments described herein relate to an image sensor with a test circuit.

2. Description of the Related Art

An image sensor includes a plurality of pixels in a two-dimensional matrix. Each pixel integrates photogenerated charges based on the amount of light incident on a photodiode. An analog pixel signal is then generated based on the integrated photogenerated charges, and an analog-to-digital converter (ADC) converts the analog pixel signal to a digital image signal.

The ADC includes a comparator and a counter. The comparator compares analog image signals corresponding to columns of the pixels with a ramp signal. The counter performs a counting operation according to a comparison result of the comparator and then generates a counting value or a counting code. The counting code is output as a pixel signal of a digital signal and is finally externally output as image data. The counting operation of the counter is used as a basis for obtaining clear image data.

SUMMARY

In accordance with one or more embodiments, an image sensor includes a pixel array including a plurality of pixels arranged in rows and columns, each of the pixels to generate an analog signal based on incident light; an analog-to-digital converter (ADC) to convert the analog signal to a digital signal using a counter; and a test logic to receive a test code in a test mode, generate a count clock signal based on the test code, test a counting operation of the counter based on the count clock signal, and externally output a test result of the counter through a test terminal.

In accordance with one or more other embodiments, a method for testing an image sensor, which converts an analog signal generated by each of a plurality of pixels into a digital signal using a counter, includes receiving a test code based on a test mode signal; generating a count clock signal based on the test code; performing a counting operation of the counter according to the count clock signal; and comparing an expected counting value according to the counting operation of the counter with the test code and externally outputting a comparison result through a test terminal.

In accordance with one or more other embodiments, an apparatus includes a converter to convert an analog signal to a digital signal using a counter; and a test logic to receive a test code, generate a count clock signal based on the test code, test a counting operation of the counter based on the count clock signal, and output a test result of the counting operation, wherein the analog signal is output from a pixel of an image sensor.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
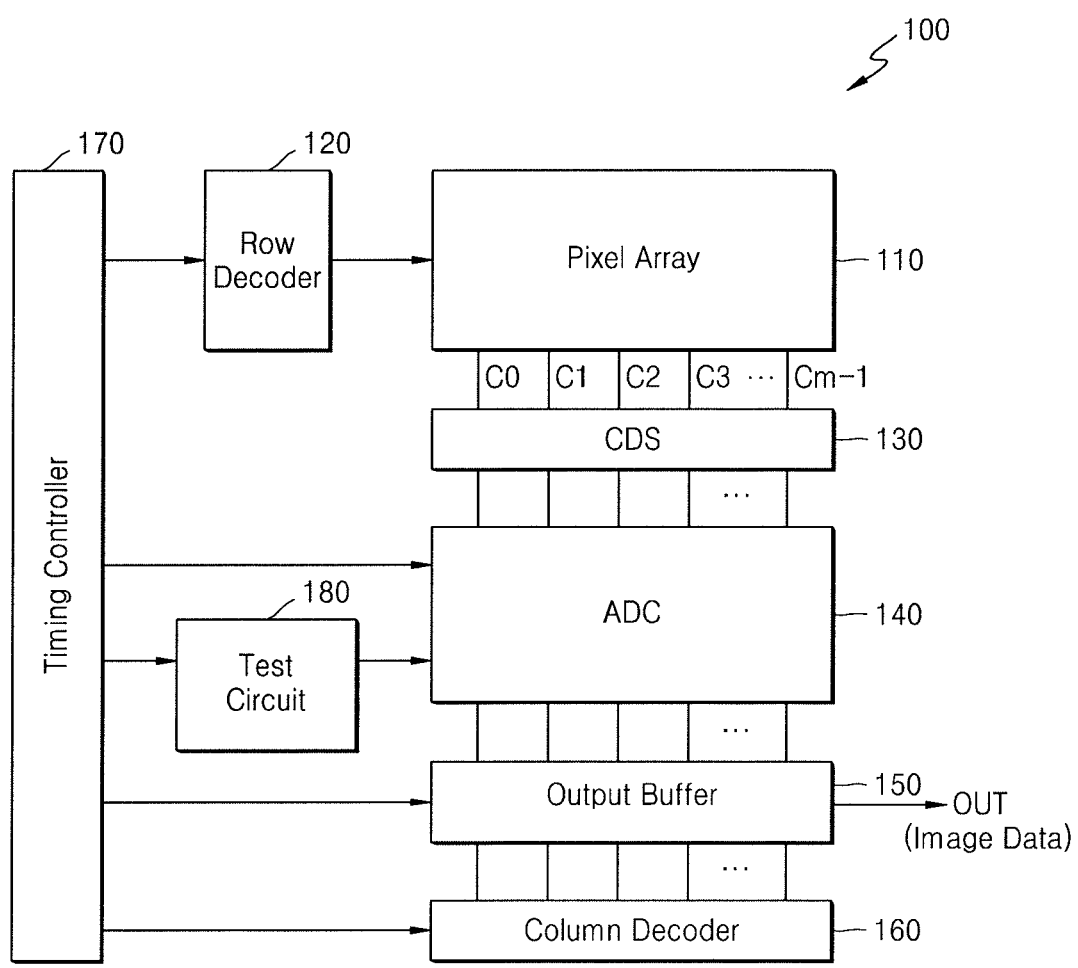
FIG. 1 illustrates an embodiment of an image sensor including a test circuit.

FIG. 1 illustrates an embodiment of an image sensor 100 including a pixel array 110, a row decoder 120, a correlated double sampler 130, an analog-to-digital converter (ADC) 140, an output buffer 150, a column decoder 160, a timing controller 170, and a test circuit 180.

The pixel array 110 includes a plurality of pixels arranged in a two-dimensional matrix. Each pixel converts light to an electrical signal. The pixel array 110 may be driven by signals such as a selection signal SEL, a reset signal RS, and a transmission signal TG from the row decoder 120. Each pixel senses an electrical signal based on the driving signals, and the sensed electrical signal is provided to the correlated double sampler 130 through a plurality of columns C0, C1, . . . , and Cm−1.

The row decoder 120 may select a row of the pixel array 110 under control of the timing controller 170. The row decoder 120 generates the selection signal SEL to select a row from among a plurality of rows. The row decoder 120 also sequentially activates the reset signal RS and the transmission signal TG for pixels corresponding to the selected row. Accordingly, a reference signal REF and an image signal IMG, that are analog signals, respectively generated from each pixel of the selected row are sequentially transmitted to correlated double sampler 130.

The correlated double sampler 130 sequentially samples and holds the reference signal REF and the image signal IMG provided to each of the plurality of columns C0, C1, . . . , and Cm−1 from the pixel array 110. For example, the correlated double sampler 130 samples and holds levels of the reference signal REF and the image signal IMG corresponding to each of the columns of the pixel array 110. The correlated double sampler 130 transmits the reference signal REF and the image signal IMG of each of the columns as a correlated double sampling signal REF/IMG to the ADC 140 under control of the timing controller 170.

The ADC 140 converts the correlated double sampling signal REF/IMG for each of the columns output from the correlated double sampler 130 to a digital signal and outputs the digital signal. The ADC 140 may generate image data with no noise corresponding to each of the columns as a counting operation and a calculation operation performed based on the correlation sample signal REF/IMG for each of the columns.

The ADC 140 may include a plurality of column counters respectively corresponding to the columns of the pixel array 110. Each column counter converts the correlated double sampling signal REF/IMG of a corresponding column to a digital signal. According to an embodiment, the ADC 140 may include a global counter, and may convert the correlated double sampling signal REF/IMG for each column to a digital signal based on a global code from the global counter.

The output buffer 150 captures image data for each column provided by the ADC 140 and outputs the captured image data. The output buffer 150 temporarily stores the image data output from the ADC 140 under control of the timing controller 170. The output buffer 150 may serve as an interface for compensating a transmission speed difference between the image sensor 100 and a device connected to the image sensor 100.

The column decoder 160 selects a column of the output buffer 150 under control of the timing controller 170, and the image data stored in the output buffer 150 is sequentially output.

The timing controller 170 controls the row decoder 120, the column decoder 160, the ADC 140, and the output buffer 150. The timing controller 170 may provide control signals TC for timing control and a clock signal CLK to operate the row decoder 120, the column decoder 160, the ADC 140, and the output buffer 150. Examples of the timing controller 170 include a logic control circuit, a phase-locked loop (PLL) circuit, a timing control circuit, and a communication interface circuit.

The test circuit 180 receives a test code in a test mode and tests a counter in the ADC 140 based on the test code. The test code may be generated in the image sensor 100 or may be received from an external source. The test circuit 180 may generate a count clock signal and a count enable signal according to the test code and may generate an offset signal for setting an initial value of a counter. The test circuit 180 may test a counting operation of the counter according to the count clock signal, the count enable signal, and the offset signal. The test circuit 180 may compare an expected counting code output through the counting of the counter with the test code and may externally output a comparison result through a test terminal.

Figure 2:
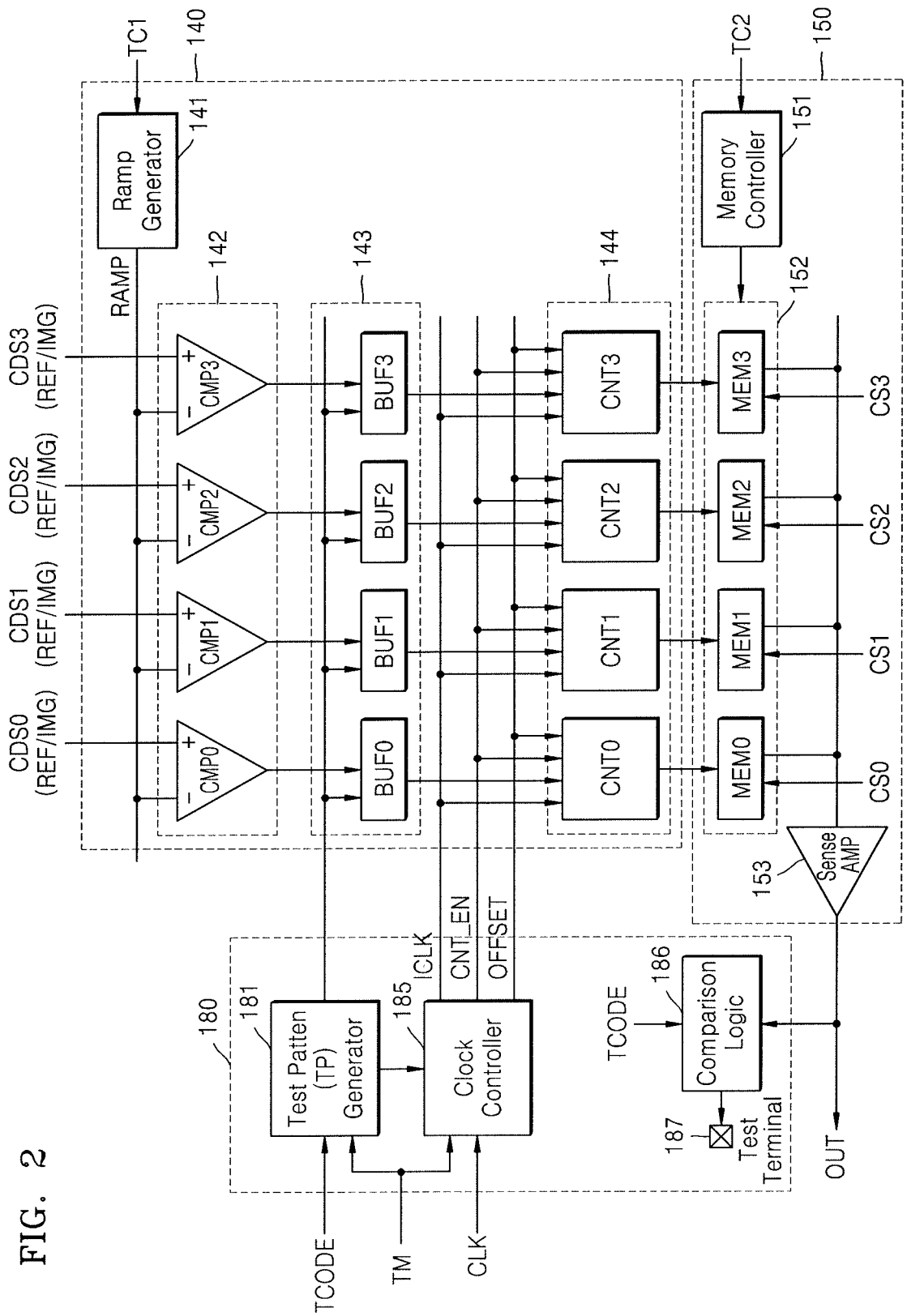
FIG. 2 illustrates an embodiment of an analog-to-digital converter (ADC), an output buffer, and the test circuit.

FIG. 2 illustrates an embodiment of the ADC 140, the output buffer 150, and the test circuit 180 in FIG. 1. The ADC 140, the output buffer 150, and the test circuit 180 of FIG. 2 will be explained using first through fourth correlated double sampling signal lines CDS0 through CDS3, which are respectively connected to first through fourth columns C0 through C3 from among the plurality of columns C0, C1, . . . , and Cm−1 of the pixel array 110. The description of the first through fourth columns C0 through C3 may apply to remaining columns.

Referring to FIG. 2, the ADC 140 includes a ramp signal generator 141, a comparison unit 142, a buffer unit 143, and a counter unit 144. The ramp signal generator 141 may generate a ramp signal RAMP having a predetermined gradient based on a control signal TC1 from the timing controller 170 (e.g., see FIG. 1). In one embodiment, the ramp signal generator 141 may generate the ramp signal RAMP having a descending gradient based on the control signal TC1. In one embodiment, the ramp signal generator 141 may generate the ramp signal RAMP having an ascending gradient based on the control signal TC1. The comparison unit 142 may use the ramp signal RAMP as a basis of comparison with the reference signal REF and the image signal IMG held by the correlated double sampler 130.

The comparison unit 142 includes first through fourth comparators CMP0, CMP1, CMP2, and CMP3 respectively provided for the first through fourth columns C0 through C3. The first through fourth comparators CMP0, CMP1, CMP2, and CMP3 compare the correlated double sampling signals REF/IMG, transmitted to the correlated double sampling signal lines CDS0 through CDS3 corresponding to the first through fourth columns C0 through C3, with the ramp signal RAMP.

The first comparator CMP0 inputs the ramp signal RAMP to a negative (−) inverting input terminal of the first comparator CMP0 and inputs the correlated double sampling signal REF/IMG of the first correlated double sampling signal line CDS0 to a positive (+) non-inverting input terminal. The first comparator CMP0 compares the ramp signal RAMP with the reference signal REF of the correlated double sampling signal REF/IMG in a first interval and provides a result to a first buffer BUF0. Next, the first comparator CMP0 compares the ramp signal RAMP with the image signal IMG of the correlated double sampling signal REF/IMG in a second interval and provides a result to the first buffer BUF0.

Like the first comparator CMP0, each of the second through fourth comparators CMP1, CMP2, and CMP3 may compare the ramp signal RAMP with the correlated double sampling signal REF/IMG for each corresponding column. A comparison result between the ramp signal RAMP and the correlated double sampling signal REF/IMG may be provided to each of second through fourth buffers BUF1, BUF2, and BUF3.

The buffer unit 143 may receive a test code TCODE from a test pattern generator 181. The buffer unit 143 may select and store the test code TCODE and one of the outputs of the first through fourth comparators CMP0 through CMP3. The buffer unit 143 includes the first through fourth buffers BUF0 through BUF3 respectively corresponding to the first through fourth comparators CMP0, CMP1, CMP2, and CMP3.

Each of the first through fourth buffers BUF0 through BUF3 may store the test code TCOD in a test mode and may store outputs of the first through fourth comparators CMP0, CMP1, CMP2, and CMP3 in normal mode. The first through fourth buffers BUF0 through BUF3 may block connection between the first through fourth comparators CMP0 through CMP3 and first through fourth counters CNT0 through CNT3 in test mode.

The counter unit 144 includes the first through fourth counters CNT0 through CNT3 respectively connected to the first through fourth buffers BUF0 through BUF3. The first through fourth counters CNT0 through CNT3 may generate counting codes by performing counting operations, which include synchronizing comparison results of the first through fourth comparators CMP0 through CMP3 stored in the first through fourth buffers BUF0 through BUF3 with a clock signal CLK. For example, each of the first through fourth counters CNT0 through CNT3 may generate a counting code by performing an up-counting operation in synchronization with the clock signal CLK. Each of the first through fourth counters CNT0 through CNT3 may generate a counting code by performing a down-counting operation in synchronization with the clock signal CLK. The counting code may be, for example, a binary code.

Figure 3:
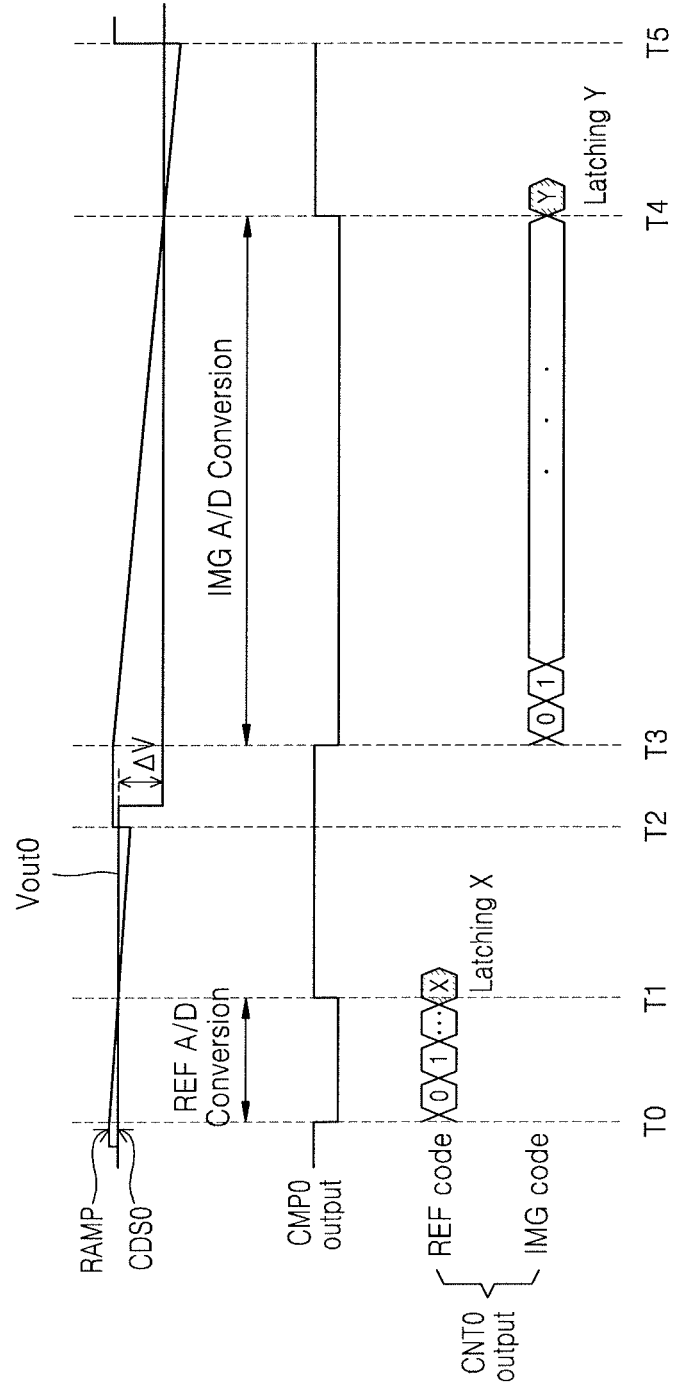
FIG. 3 illustrates an embodiment for explaining operation of the ADC.

FIG. 3 illustrates a timing diagram for describing operation of ADC 140 according to one embodiment. In FIG. 3, the first correlated double sampling signal line CDS0 corresponding to one column will be explained. The ADC 140 may process the second through fourth correlated double sampling signal lines CDS1 through CDS3 in the same manner.

Referring to FIG. 3, an operation interval for converting the correlated double sampling signal REF/IMG (that is an analog signal of the first correlated double sampling signal line CDS0) to a digital signal may be roughly divided into two intervals. The first interval is an interval for converting the reference signal REF of the correlated double sampling signal REF/IMG to a digital signal. This internal may range from a time T0 to a time T2 in the timing diagram. The second interval is an interval for converting the image signal IMG of the correlated double sampling signal REF/IMG to a digital signal. This interval may range from a time T3 through T5 in the timing diagram.

From time T0, a gradient of the ramp signal RAMP decreases. A comparison operation of the first comparator CMP0 is activated and a count-up operation of the first counter CNT0 is started. From time T0 to time T1, during which the level of the ramp signal RAMP is greater than the level of the reference signal REF of the correlated double sampling signal REF/IMG, an output of the first comparator CMP0 may maintain, for example, a logic low level L. From time T1, the level of the reference signal REF of the correlated double sampling signal line CDS0 increases to be greater than the level of the ramp signal RAMP that descends. Accordingly, an output of the first comparator CMP0 may change to, for example, a logic high level H.

At time T1, the first counter CNT0 may be counted upwardly, in an interval during which the output of the first comparator CMP0 has the logic low level L, to latch a digital signal value (e.g., a reference code X) corresponding to the reference signal REF.

At time T2, the ramp signal RAMP and the first counter CNT0 are initialized. For example, the ramp signal RAMP increases to an initial level of the ramp signal RAMP and the first counter CNT0 is reset. The image signal IMG of the correlated double sampling signal REF/IMG is input to the first comparator CMP0. In this case, since the image signal IMG is a pixel signal generated according to photogenerated charges integrated to correspond to the amount of incident light, the image signal IMG may be less than the reference signal REF.

From time T3, a gradient of the ramp signal RAMP begins to decrease. At the same time. a comparison operation of the first comparator CMP0 is activated and counting of the reset first counter CNT0 is started. From time T3 to time T4, during which a level of the ramp signal RAMP is greater than a level of the image signal IMG, an output of the first comparator CMP0 may maintain the logic low level L. From time T4, when a level of the image signal IMG increases to be greater than a level of the ramp signal RAMP, an output of the first comparator CMP0 may change to the logic high level H.

At time T4, the first counter CNT0 may be counted upwardly, in an interval during which the output of the first comparator CMP0 has the logic low level L, to latch a digital signal value (e.g., an image code Y) corresponding to the image signal IMG. An operation of converting the image signal IMG to a digital signal may end at time T5.

As a result, at times T0 and T3 from which the ramp signal RAMP decreases, a count-up operation of the first counter CNT0 is initialized, a comparison operation of the first comparator CMP0 is activated, and a comparison result between the ramp signal RAMP and each of the image signal IMG and the reference signal REF of the correlated double sampling signal REF/IMG is output. At times T1 and T4, at which an output of the first comparator CMP0 changes from the logic low level L to the logic high level H, the reference code X and the image code Y are obtained.

Referring to FIG. 2, the ADC 140 may output image data by processing the reference code X (corresponding to the reference signal REF) and the image code Y (corresponding to the image signal IMG) for each column by using the counter unit 144. For example, the ADC 140 may include a calculator for performing a subtraction operation. The ADC 140 may subtract the reference code X from the image code Y corresponding to each column using the calculator. Accordingly, the ADC 140 may output image data with no noise. The image data may be stored in a column memory unit 152 of the output buffer 150.

The output buffer 150 includes a memory controller 151, the column memory unit 152, and a sense amplifier 153. The memory controller 151 controls inputs/outputs of first through fourth column memories MEM0 through MEM3 based on a control signal TC2 from the timing controller 170. The column memory unit 152 includes the first through fourth column memories MEM0 through MEM3 that store pieces of image data corresponding to the columns. The pieces of image data stored in the first through fourth column memories MEM0 through MEM3 are sequentially transmitted to the sense amplifier 153 according to first through fourth column selection signals CS0 through CS3 from the column decoder 160 (e.g., see FIG. 1) and are externally output.

Each image data may be generated based on the reference code X corresponding to the reference signal REF and the image code Y corresponding to the image signal IMG for each column. Obtaining of the reference code X and the image code Y is dominant in counting operations of the first through fourth counters CNT0 through CNT3. Hence, as long as operation characteristics may be checked by testing counting operations of the first through fourth counters CNT0 through CNT3, clear image data may be obtained. The first through fourth counters CNT0 through CNT3 may be tested by the test circuit 180.

The test circuit 180 tests the first through fourth counters CNT0 through CNT3 according to a test mode signal TM, the clock signal CLK, and the test code TCODE from the timing controller 170. The test circuit 180 includes the test pattern generator 181, a clock controller 185, a comparison logic unit 186, and a test terminal 187.

The test pattern generator 181 receives the test code TCODE based on the test mode signal TM and provides the test code TCODE to the buffer unit 143 and the clock controller 185. The test mode signal TM may be a signal for requesting to test the first through fourth counters CNT0 through CNT3 of the ADC 140. The test code TCODE that is a code for controlling a counting operation (e.g., the number of counting operations) of each of the first through fourth counters CNT0 through CNT3 may be provided in various ways.

The clock controller 185 may receive the clock signal CLK and generate a count clock signal ICLK and a count enable signal CNT_EN according to the test code TCODE from the test pattern generator 181 based on the test mode signal TM. Also, the clock controller 185 may generate an offset signal OFFSET for setting an initial value of each of the first through fourth counters CNT0 through CNT3 based on the test mode signal TM. The count clock signal ICLK, the count enable signal CNT_EN, and the offset signal OFFSET may be selectively provided to the first through fourth counters CNT0 through CNT3.

The first through fourth counters CNT0 through CNT3 may each perform a counting operation according to the count clock signal ICLK and the count enable signal CNT_EN in a test mode. Counting values of the first through fourth counters CNT0 through CNT3 according to the count clock signal ICLK and the count enable signal CNT_EN may be sequentially output as expected counting values through the output buffer 150.

The comparison logic unit 186 compares the expected counting values of the first through fourth counters CNT0 through CNT3 from the output buffer 150 with the test code TCODE, and outputs a comparison result to the test terminal 187. When the expected counting values of the first through fourth counters CNT0 through CNT3 and the test code TCODE are the same, the comparison logic unit 186 may output, for example, a signal of the logic high level H indicating a counting operation pass to the test terminal 187. When the expected counting values of the first through fourth counters CNT0 through CNT3 and the test code TCODE are not the same, the comparison logic unit 186 may output, for example, a signal of the logic low level L indicating a counting operation fail to the test terminal 187.

The logic level output to the test terminal 187 may be monitored to directly check whether a counting operation of each of the first through fourth counters CNT0 through CNT3 passes or fails.

Figure 4A:
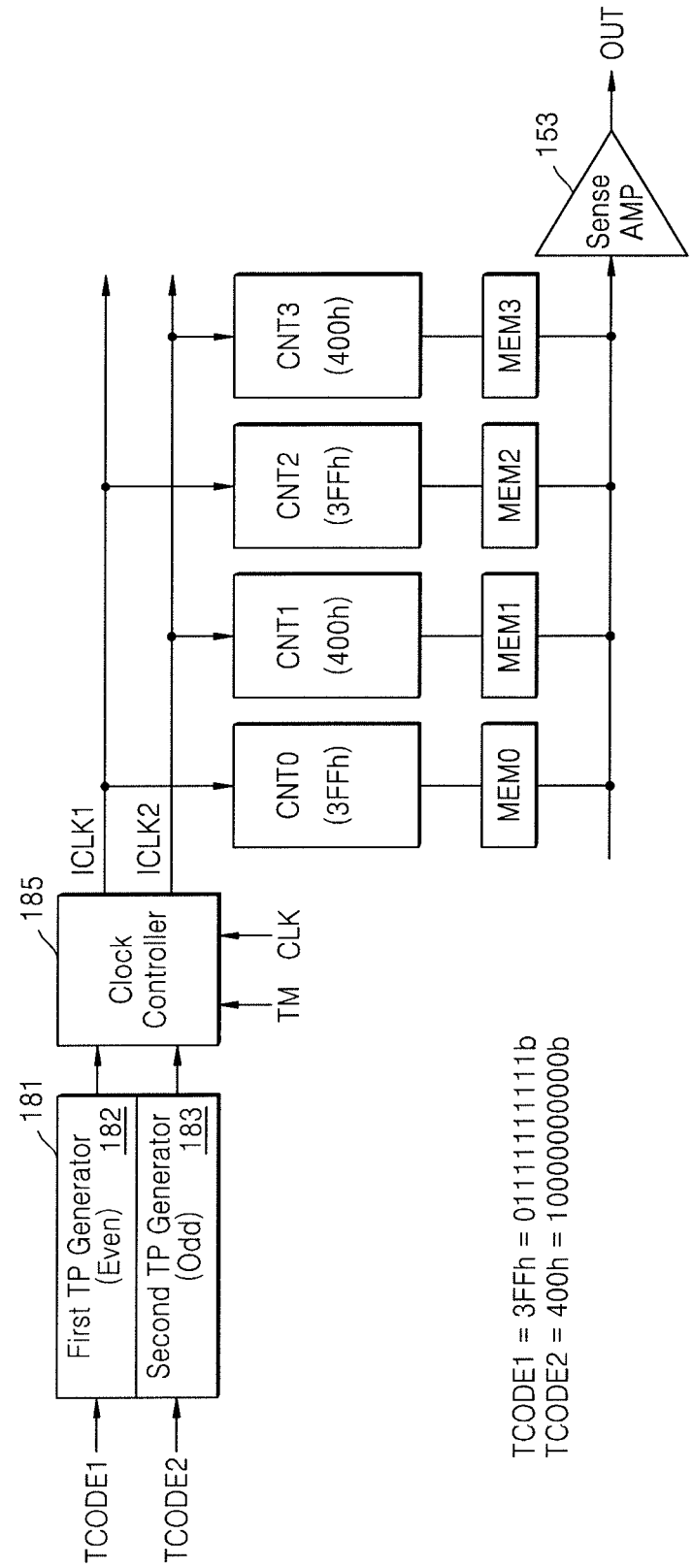
FIGS. 4A and 4B illustrate an embodiment of a method for testing counters.
Figure 4B:
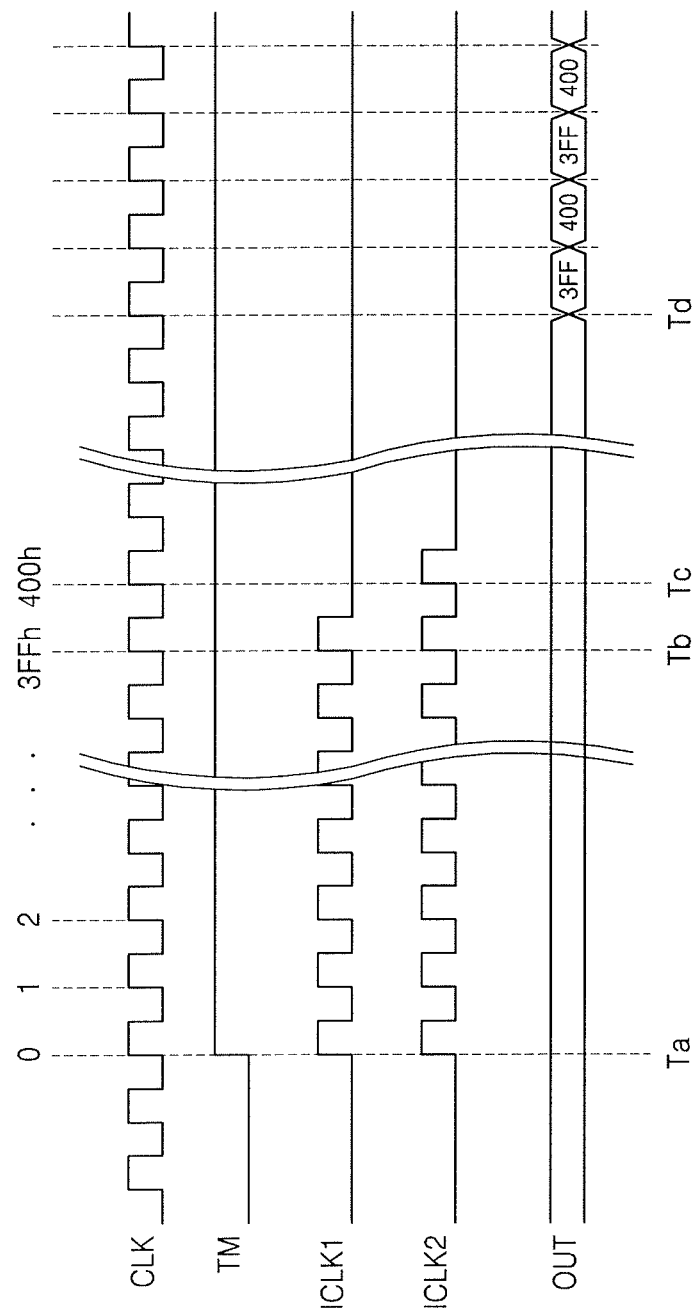

FIGS. 4A and 4B illustrate an embodiment for explaining a method for testing the first through fourth counters CNT0 through CNT3 in FIG. 2. FIG. 4A explains a method for testing the first through fourth counters CNT0 through CNT3 according to first and second count clock signals ICLK1 and ICLK2 corresponding to first and second test codes TCODE1 and TCODE2.

Referring to FIG. 4A, the test pattern generator 181 includes a first pattern generator 182 and a second pattern generator 183. The first pattern generator 182 receives the first test code TCODE1 for testing the first and third counters CNT0 and CNT2 corresponding to even columns, for example, the first and third columns C0 and C2, from among columns of the pixel array 110 (e.g., see FIG. 1). The first test code TCODE1 is provided to the clock controller 185. The second pattern generator 183 receives the second test code TCODE2 for testing the second and fourth counters CNT1 and CNT3 corresponding to odd columns, for example, the second and fourth columns C1 and C3, from among the columns of the pixel array 110 (e.g., see FIG. 1). The second test code TCODE2 is provided to the clock controller 185.

According to an embodiment, the first pattern generator 182 may provide the first test code TCODE1 to the clock controller 185 to test the second and fourth counters CNT1 and CNT3 corresponding to the odd columns (e.g., the second and fourth columns C1 and C3 in pixel array). The second pattern generator 183 may provide the second test code TCODE2 to the clock controller 185 to test the first and third counters CNT0 and CNT2 corresponding to the even columns (e.g., the first and third columns C0 and C2 in pixel array 110).

For example, the first test code TCODE1 may be provided as 01111111111b that is an 11-bit binary code or 3FFh that is a hexa code. The second test code TCODE2 may be provided as 10000000000b that is an 11-bit binary code or 400h that is a hexa code. The codes 3FFh and 400h may be used to perform a full-bit toggling method. The first and second test codes TCODE1 and TCODE2 may be provided in various ways.

The clock controller 185 generates the clock signal CLK, and generates the first count clock signal ICLK1 and the second count clock signal ICLK2 respectively corresponding to the first test code TCODE1 and the second test code TCODE2. For example, the clock controller 185 may generate the first count clock signal ICLK1 as a clock signal corresponding to the first test code TCODE1 from the first test pattern generator 182. The clock generator 185 may generate the second count clock signal ICLK2 as a clock signal corresponding to the second test code TCODE2 from the second test pattern generator 183.

The clock controller 185 provides the first count clock signal ICLK1 to the even counters, for example, the first and third counters CNT0 and CNT2. The second count clock signal ICLK2 is provided to the odd counters, for example, the second and fourth counters CNT1 and CNT3. According to an embodiment, the first count clock signal ICLK1 may be provided to the second and fourth counters CNT1 and CNT3 and the second count clock signal ICLK2 may be provided to the first and third counters CNT0 and CNT2.

Each of the even counters (e.g., the first and third counters CNT0 and CNT2) may perform a counting operation according to the first count clock signal ICLK1. The first count clock signal ICLK1 is a clock signal corresponding to the first test code TCODE1. When a counting operation performed by each of the first and third counters CNT0 and CNT2 according to the first count clock signal ICLK1 is normal, a counting value of each of the first and third counters CNT0 and CNT2 may be output as a value that is the same as the first test code TCODE1. When a counting operation of each of the first and third counters CNT0 and CNT2 is abnormal, a counting value of each of the first and third counters CNT0 and CNT2 may be output as a value different from the first test code TCODE1.

Each of the odd counters (e.g., the second and fourth counters CNT1 and CNT3) may perform a counting operation according to the second count clock signal ICLK2. The second count clock signal ICLK2 is a clock signal corresponding to the second test code TCODE2. When a counting operation that is performed by each of the second and fourth counters CNT1 and CNT3 according to the second count clock signal ICLK2 is normal, a counting value of each of the second and fourth counters CNT1 and CNT3 may be output as a value that is the same as the second test code TCODE2. When a counting operation of each of the second and fourth counters CNT1 and CNT3 is abnormal, a counting value of each of the second and fourth counters CNT1 and CNT3 may be output as a value other than the second test code TCODE2.

Counting values of the first through fourth counters CNT0 through CNT3 may be stored in a column memory MEM_MEM3 and may be sequentially output through sense amplifier 153.

FIG. 4B illustrates an embodiment of a counting operation of each of the first through fourth counters CNT0 through CNT3. Referring to FIG. 4B, the clock signal CLK may be provided to the clock controller 185. At time Ta, the clock controller 185 may generate the first count clock signal ICLK1 corresponding to 3FFh, that is the first test code TCODE1, based on the test mode signal TM. The first count clock signal ICLK1 may be provided to the first and third counters CNT0 and CNT2 that are even counters. The clock controller 185 may generate the second count clock signal ICLK2 corresponding to 400h, that is the second test code TCODE2, based on the test mode signal TM. The second count clock signal ICLK2 may be provided to the second and fourth counters CNT1 and CNT3 that are odd counters.

From time Ta to time Tb, the first and third counters CNT0 and CNT2 may count the first count clock signal ICLK1 and may output counting values.

From time Ta to time Tc, the second and fourth counters CNT1 and CNT3 may output the second count clock signal ICLK2 and may output counting values.

From time Td, the first through fourth counters CNT0 through CNT3 may output counting values of 3FFh, 400h, 3FFh, and 400h in the order of the first counter CNT0, the second counter CNT1, the third counter CNT2, and the fourth counter CNT3 (e.g., in the order of an even counter, an odd counter, an even counter, and an odd counter) through the output buffer 150.

At time Td, the counting values of 3FFh, 400h, 3FFh, and 400h of the first through fourth counters CNT0 through CNT3 that are sequentially output may be sequentially compared in the order of the first test code TCODE1, the second test code TCODE2, the first test code TCODE1, and the second test code TCODE2, by the comparison logic unit 186 (e.g., see FIG. 2). The comparison logic unit 186 may output the logic high level H indicating a counting operation pass to the test terminal 187 when the counting values of the first through fourth counters CNT0 through CNT3 and the first and second test codes TCODE1 and TCODE2 are the same. The comparison logic unit 186 may output the logic low level L indicating a counting operation fail when the counting values of the first through fourth counters CNT0 through CNT3 and the first and second test codes TCODE1 and TCODE2 are not the same.

The logic level of the test terminal 187 may be monitored to check whether a counting operation of each of the first through fourth counters CNT0 through CNT3 passes or fails.

Figure 5A:
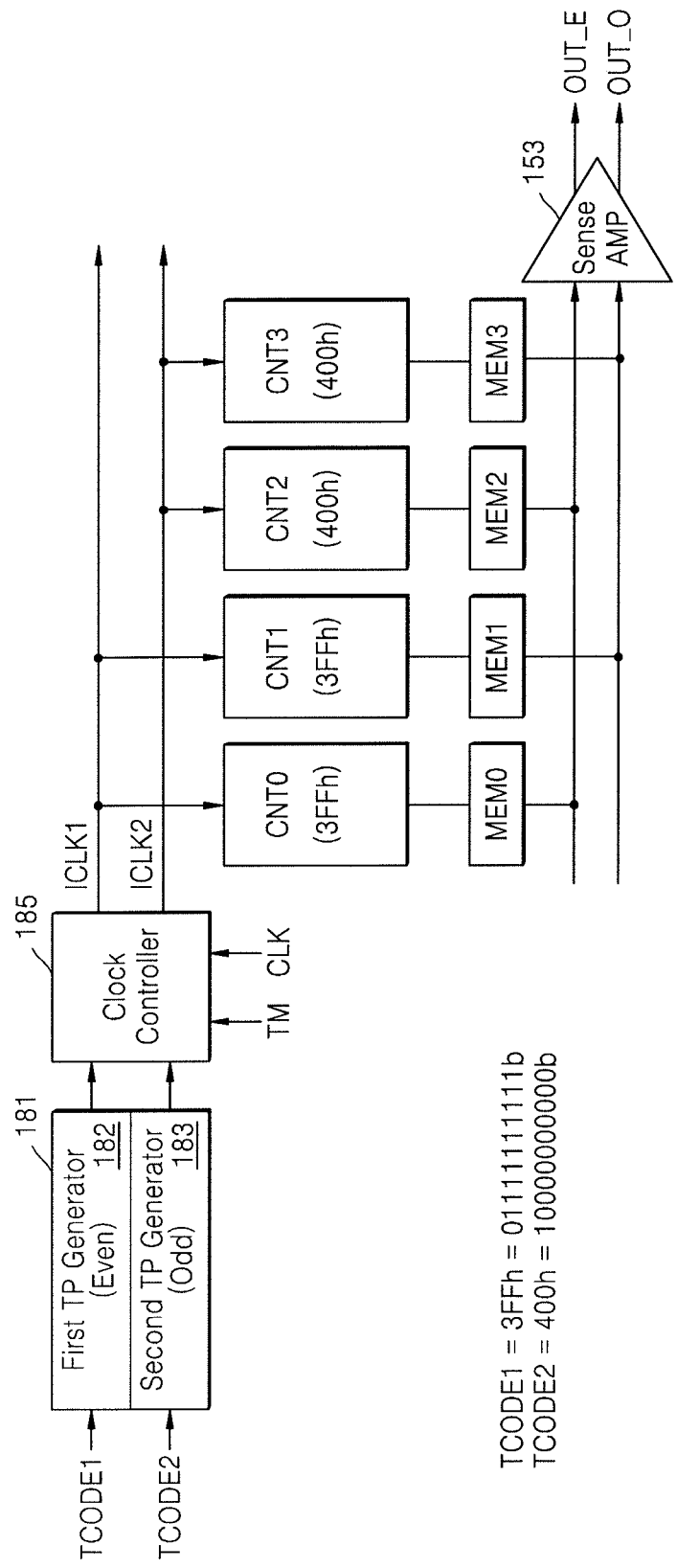
FIGS. 5A and 5B illustrate another embodiment of a method for testing the counters.
Figure 5B:
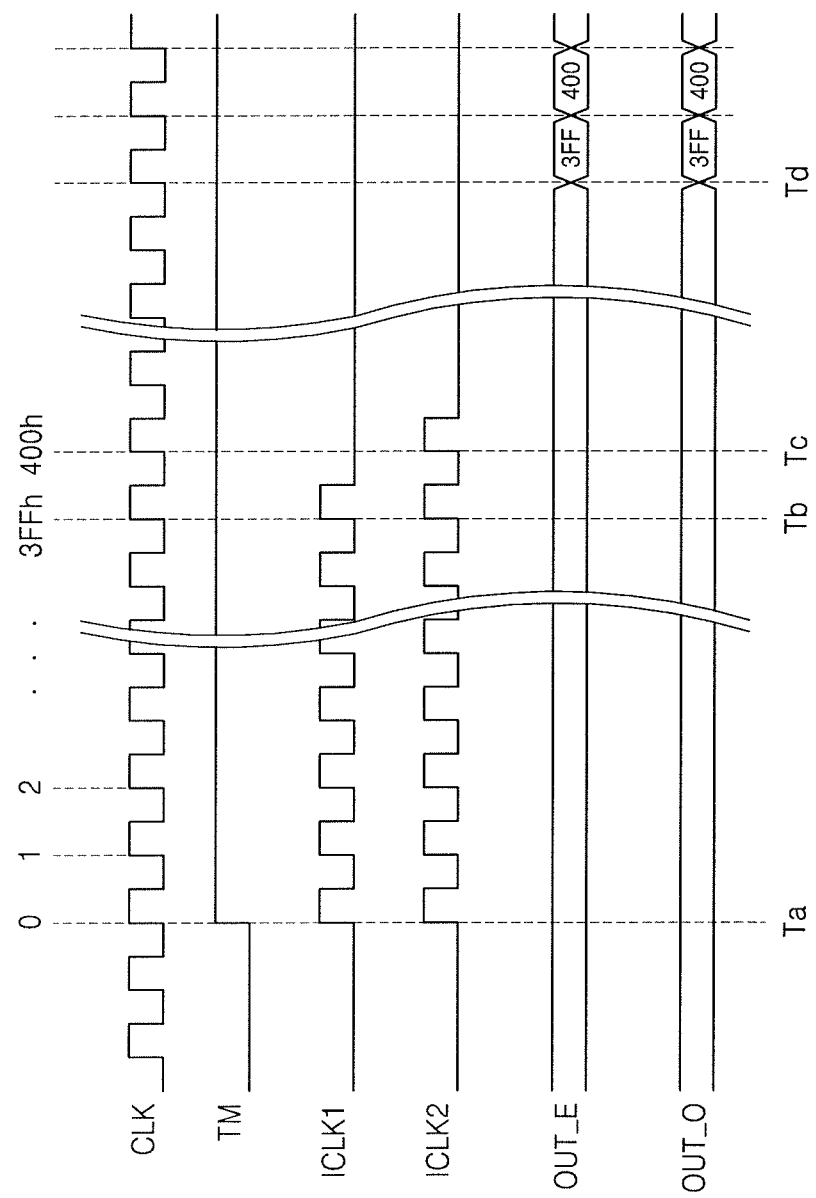

FIGS. 5A and 5B illustrate another embodiment for explaining a method for testing the counters of FIG. 2. When it is assumed that two adjacent columns from among columns of the pixel array 110 are used as a pair, FIG. 5A explains the method for testing the first through fourth counters CNT0 through CNT3. The method includes providing the first test code TCODE1 for testing the first and second counters CNT0 and CNT1 corresponding to the first column C0 (which is an even column) and the second column C1 (which is an odd column) of a first pair, and providing the second test code TCODE2 for testing the third and fourth counters CNT2 and CNT3 corresponding to the third column C2 (which is an even column) and the fourth column C3 (which is an odd column) of a second pair.

Referring to FIG. 5A, the first count clock signal ICLK1 corresponding to the first test code TCODE1 and the second count clock signal ICLK2 corresponding to the second test code TCODE2 are generated by the clock controller 185 and are provided to the first through fourth counters CNT0 through CNT3. The first count clock signal ICLK1 is provided to the first and second counters CNT0 and CNT1 and the second count clock signal ICLK2 is provided to the third and fourth counters CNT2 and CNT3.

Each of the first and second counters CNT0 and CNT1 performs a counting operation based on the first count clock signal ICLK1. When a counting operation based on the first count clock signal ICLK1 is normally performed, each of the first and second counters CNT0 and CNT1 may output a counting value that is the same as the first test code TCODE1. Each of the third and fourth counters CNT2 and CNT3 performs a counting operation based on the second count clock signal ICLK2. When a counting operation based on the second count clock signal ICLK21 is normally performed, each of the third and fourth counters CNT2 and CNT3 may output a counting value that is the same as the second test code TCODE2.

Counting values of the first through fourth counters CNT0 through CNT3 are stored in the column memory MEM_–MEM3 in the output buffer 150 and are sequentially output through the sense amplifier 153. The sense amplifier 153 sequentially outputs counting values of the first and third counters CNT0 and CNT2 (that is, even counters) from among the first through fourth counters CNT0 through CNT3 through a first output line OUT_E, and sequentially outputs counting values of the second and fourth counters CNT1 and CNT3 (that is, odd counters) through a second output line OUT_O.

Referring to FIG. 5B, from time Ta to time Tc, the first and second counters CNT0 and CNT1 may count the first count clock signal ICLK1 and may output counting values, and the third and fourth counters CNT2 and CNT3 may count the second count clock signal ICLK2 and may output counting values.

From time Td, counting values of 3FFh and 400h of the first and third counters CNT0 and CNT2 may be output to the first output line OUT_E. Counting values of 3FFh and 400h of the second and fourth counters CNT1 and CNT3 may be output to the second output line OUT_O.

At time Td, the counting values of 3FFh and 400h of even counters of the first output line OUT_E that are sequentially output may be sequentially compared by the comparison logic unit 186 with the first test code TCODE1 and the second test code TCODE2. The counting values of 3FFH and 400h of odd counters of the second output line OUT_O that are sequentially output may be sequentially compared by the comparison logic unit 186 with the first test code TCODE1 and the second test code TCODE2.

The comparison logic unit 186 may output a result obtained after comparing the counting values of the even counters of the first output line OUT_E with the first and second test codes TCODE1 and TCODE2 to a first test terminal. A result obtained after comparing the counting values of the odd counters of the second output line OUT_O with the first and second test codes TCODE1 and TCODE2 may be output to a second test terminal. The test terminal 187 of FIG. 2 may include the first and second test terminals.

The comparison logic unit 186 may output the logic high level H (indicating a counting operation pass) to the first test terminal when the counting values of the even counters of the first output line OUT_E and the first and second test codes TCODE1 and TCODE2 are the same. The comparison logic unit 186 may output the logic low level L (indicating a counting operation fail) when the counting values of the even counters of the first output line OUT_E and the first and second test codes TCODE1 and TCODE2 are not the same.

The logic levels of the first and second test terminals may be monitored by directly checking whether a counting operation of each of the first through fourth counters CNT0 through CNT3 passes or fails.

Figure 6A:
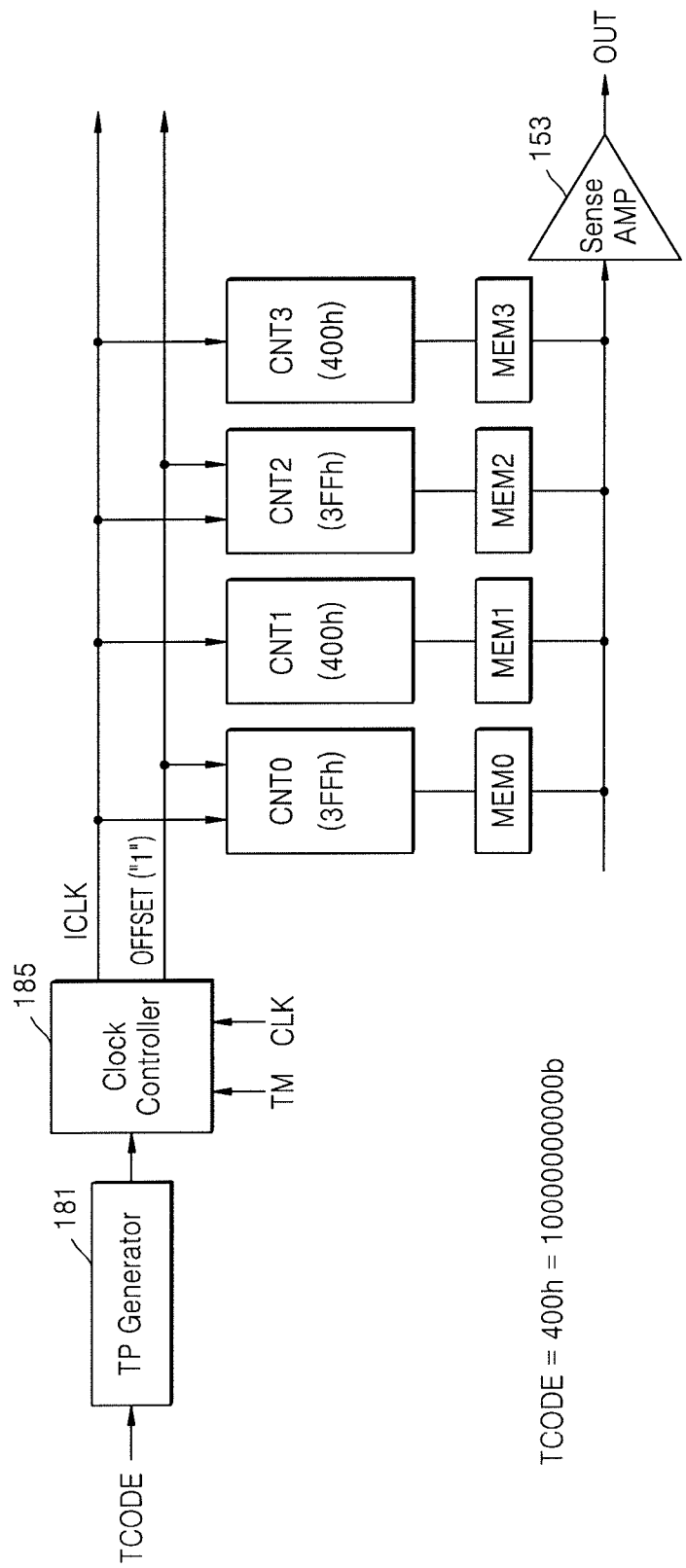
FIGS. 6A and 6B illustrate another embodiment of a method for testing the counters.
Figure 6B:
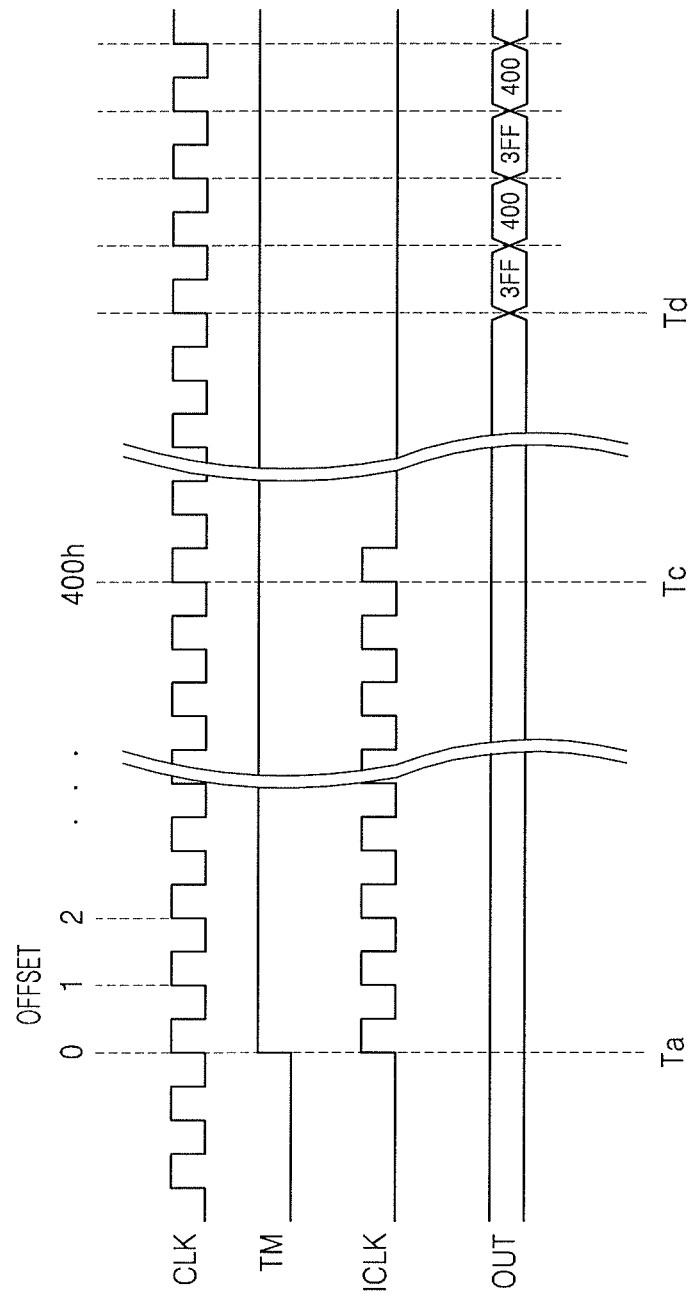

FIGS. 6A and 6B illustrate another embodiment for explaining a method of testing the counters in FIG. 2. FIG. 6A explains a method for providing the offset signal OFFSET to set an initial value to some of the first through fourth counters CNT0 through CNT3 and testing the first through fourth counters CNT0 through CNT3 according to the count clock signal ICLK corresponding to the test code TCODE.

Referring to FIG. 6A, the count clock signal ICLK corresponding to the test code TCODE of the test pattern generator 181 is generated by the clock controller 185. The count clock signal ICLK is provided to the first through fourth counters CNT0 through CNT3. The test code TCODE may be provided as, for example, 400h that is a hexa code.

Each of the first through fourth counters CNT0 through CNT3 performs a counting operation based on the count clock signal ICLK. In this case, for example, initial values of the first and third counters CNT0 and CNT2 (even counters) may be set based on the offset signal OFFSET. The offset signal OFFSET may be provided from the clock controller 185 based on the test mode signal TM. The offset signal OFFSET may be provided as, for example, 1b that is a 1-bit binary code, e.g., 1. According to an embodiment, the offset signal OFFSET may be provided as a binary code having a predetermined number of bits.

Each of the first and third counters CNT0 and CNT2 (even counters) may perform a counting operation based on the count clock signal ICLK beginning from the offset signal OFFSET of 1. Each of the second and fourth counters CNT1 and CNT3 (odd counters) may perform a counting operation based on the count clock signal ICLK beginning from an initial value of 0. When a counting operation is normally performed, each of the first and third counters CNT0 and CNT2 may output a counting value that is the same as a test code TCODE-1, obtained after subtracting the offset signal OFFSET of 1 from the test code TCODE. When a counting operation is normally performed, each of the second and fourth counters CNT1 and CNT3 may output a counting value that is the same as the test code TCODE.

Counting values of the first through fourth counters CNT0 through CNT3 are stored in the column memory MEM_MEM3 and are sequentially output through the sense amplifier 153.

Referring to FIG. 6B, from time Ta to time Tc, each of the first through fourth counters CNT0 through CNT3 may perform a counting operation based on the counting clock signal ICLK and may output a counting value.

From time Td, counting values of the first through fourth counters CNT0 through CNT3 are output to an output line OUT. Counting values of 3FFh, 400h, 3FFh, and 400h of the first through fourth counters CNT0 through CNT3 of the output line OUT may be compared by the comparison logic unit 186 in the order of the test code TCODE-1, the test code TCODE, the test code TCODE-1, and the test code TCODE.

The comparison logic unit 186 may output the logic high level H indicating a counting operation pass to the test terminal 187 when the counting values of the first through fourth counters CNT0 through CNT3 and the test codes TCODE-1 and TCODE are the same. The comparison logic unit 186 may output the logic low level L indicating a counting operation fail when the counting values of the first through fourth counters CNT0 through CNT3 and the test codes TCODE-1 and TCODE are not the same.

Next, the logic level of the test terminal 187 may be directly checked to determine whether a counting operation of each of the first through fourth counters CNT0 through CNT3 passes or fails.

Figure 7A:
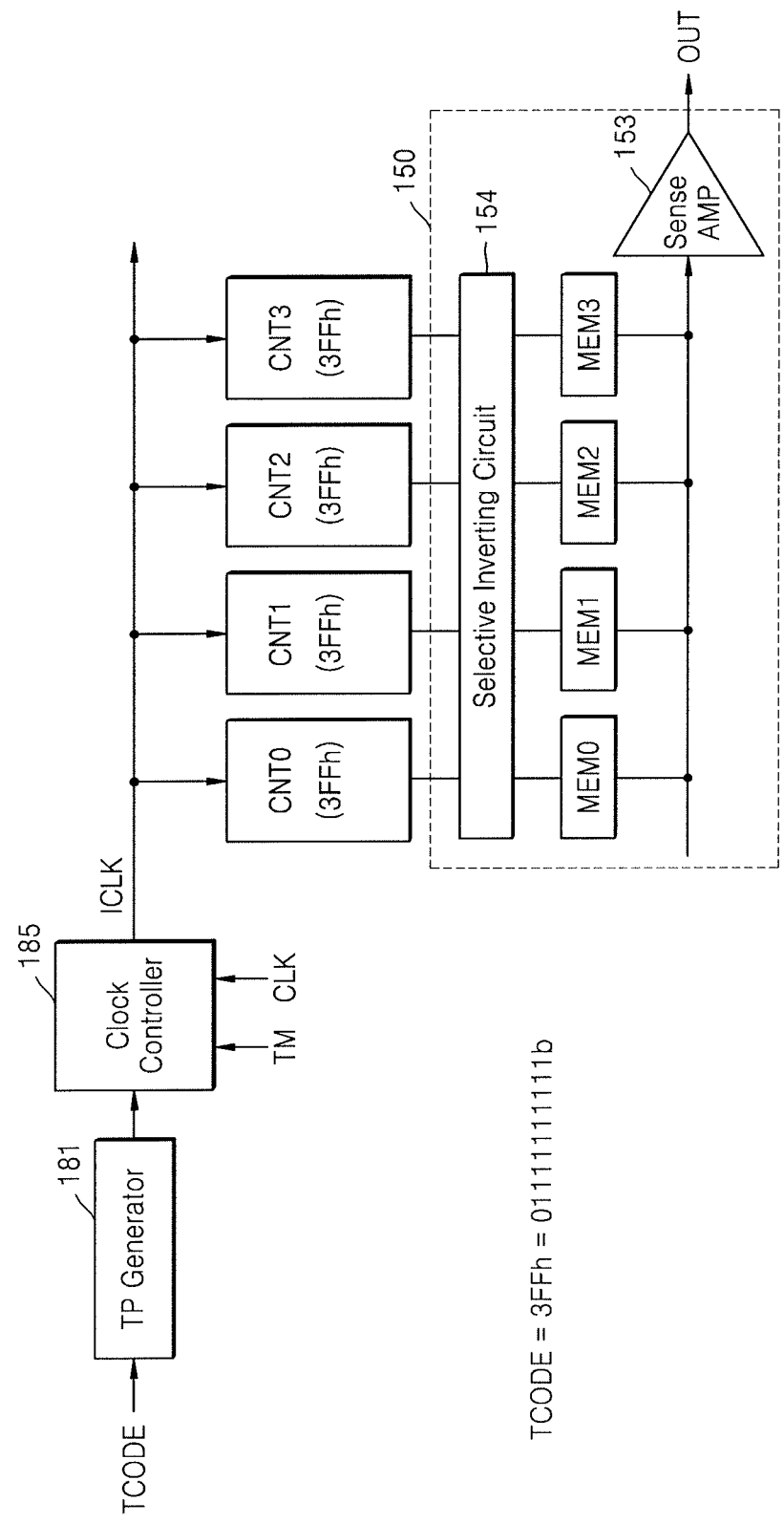
FIGS. 7A and 7B illustrate another embodiment of method for testing counters.
Figure 7B:
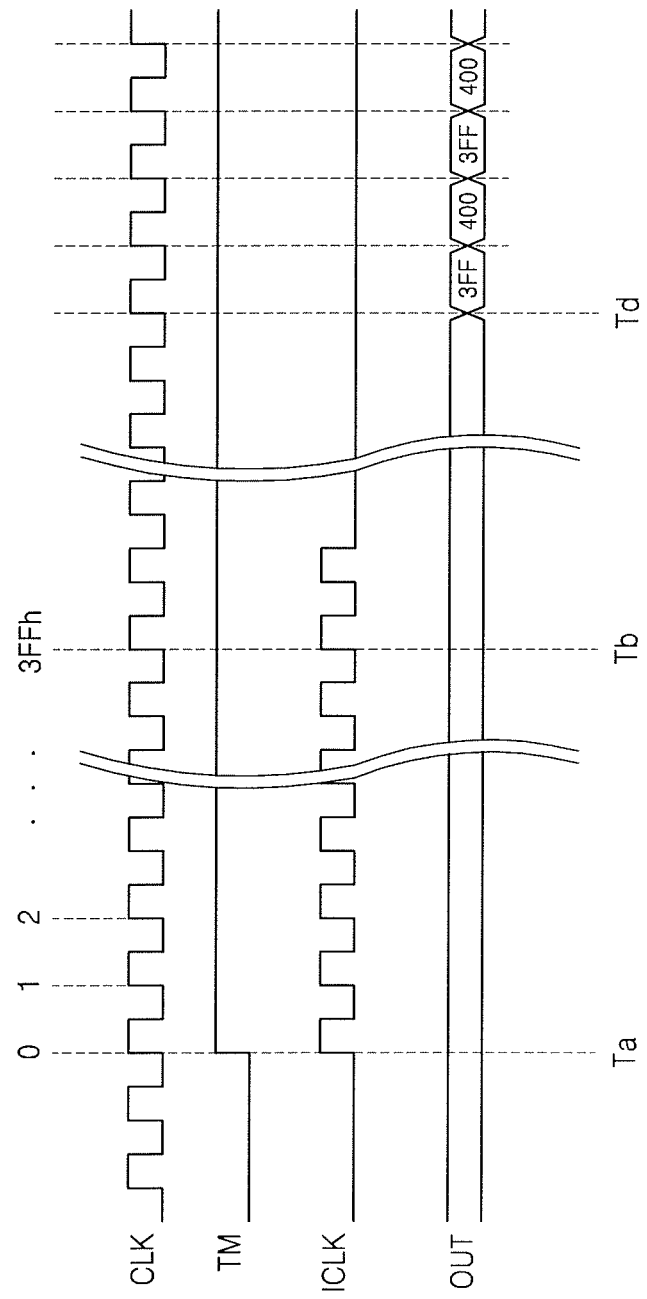

FIGS. 7A and 7B illustrate another embodiment for explaining a method for testing the counters in FIG. 2. FIG. 7A explains a method for testing the first through fourth counters CNT0 through CNT3 according to the count clock signal ICLK corresponding to the test code TCODE using a selective inverting circuit 154 for inverting counting values of some counters.

Referring to FIG. 7A, the count clock signal ICLK corresponding to the test code TCODE of the test pattern generator 181 is generated by the clock controller 185. The count clock signal ICLK is provided to the first through fourth counters CNT0 through CNT3. The test code TCODE may be provided as, for example, 3FFh that is a hexa code.

Each of the first through fourth counters CNT0 through CNT3 performs a counting operation according to the count clock signal ICLK. When a counting operation of each of the first through fourth counters CNT0 through CNT3 is normally performed, a counting value of 3FFh that is the same as the test code TCODE may be output.

The first through fourth counters CNT0 through CNT3 may be connected to the selective inverting circuit 154. The selective inverting circuit 154 may be in the output buffer 150 and may selectively invert counting values of the first through fourth counters CNT0 through CNT3. For example, the selective inverting circuit 154 may invert counting values of the second and fourth counters CNT1 and CNT3 (odd counters) from among the first through fourth counters CNT0 through CNT3. Counting values of 3FFh of the second and fourth counters CNT1 and CNT3 may be inverted by the selective inverting circuit 154 and may be output as 400h that is an inverted test code /TCODE. Counting values of the first and third counters CNT0 and CNT2 may be output as 3FFh.

Counting values of the first through fourth counters CNT0 through CNT3 are stored in the column memory MEM_MEM3 and are sequentially output through the sense amplifier 153.

Referring to FIG. 7B, from time Ta to time Tc, the first through fourth counters CNT0 through CNT3 may perform counting operations based on the count clock signal ICLK and may output counting values. Next, inverted counting values of the second and fourth counters CNT1 and CNT3 may be output.

From time Td, counting values of the first through fourth counters CNT0 through CNT3 are output to the output line OUT. Counting values of 3FFh, 400h, 3FFh, and 400h of the first through fourth counters CNT0 through CNT3 of the output line OUT may be compared by the comparison logic unit 186 in the order of the test code TCODE, the inverted test code /TCODE, the test code TCODE, and the inverted test code /TCODE.

The comparison logic unit 186 may output the logic high level H indicating a counting operation pass when the counting values of the first through fourth counters CNT0 through CNT3 and the test codes TCODE and /TCODE are the same. Comparison logic unit 186 may output the logic low level L indicating a counting operation fail when the counting values of the first through fourth counters CNT0 through CNT3 and test codes TCODE and /TCODE are not the same.

Next, the logic level of the test terminal 187 may be directly checked to determine whether a counting operation of each of the first through fourth counters CNT0 through CNT3 passes or fails.

Figure 8A:
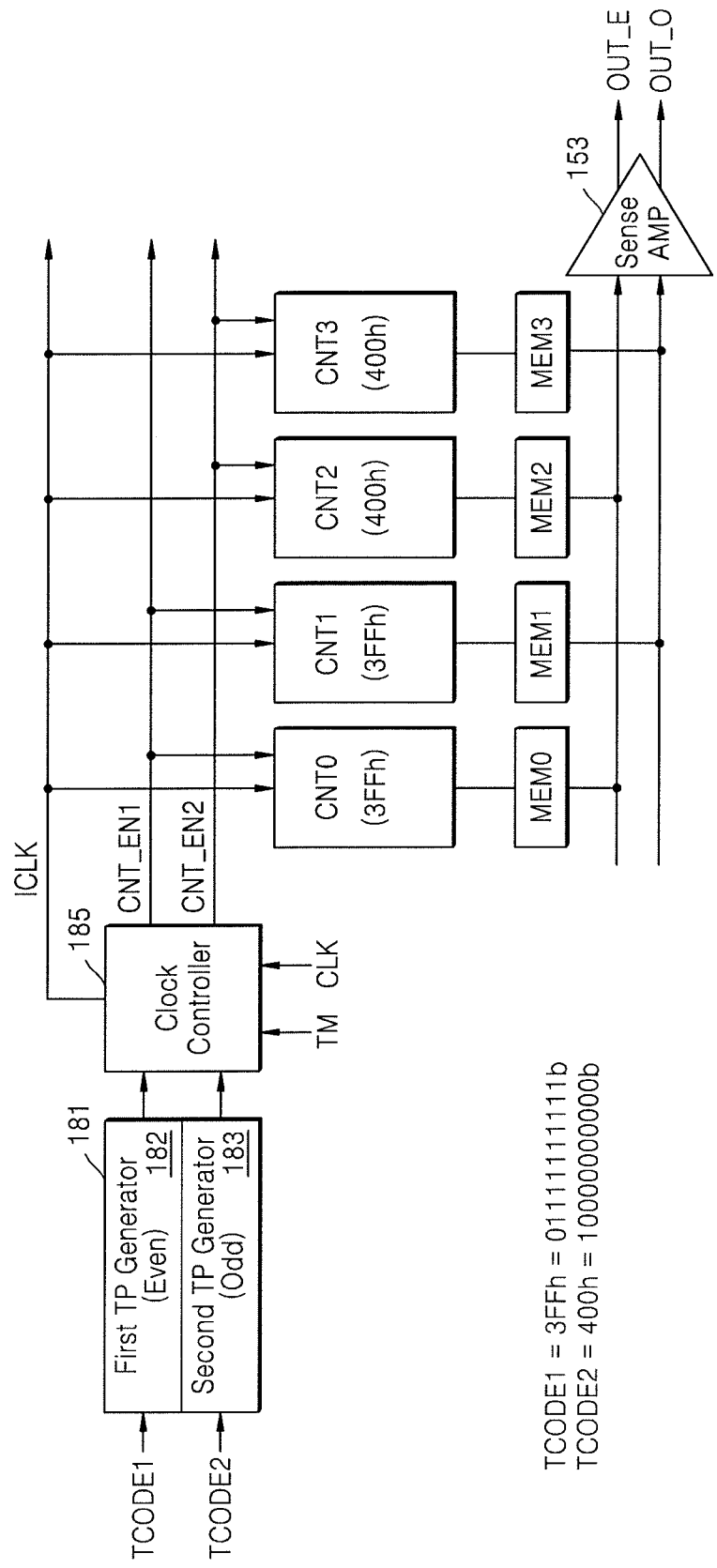
FIGS. 8A and 8B illustrate another embodiment of a method for testing counters.
Figure 8B:
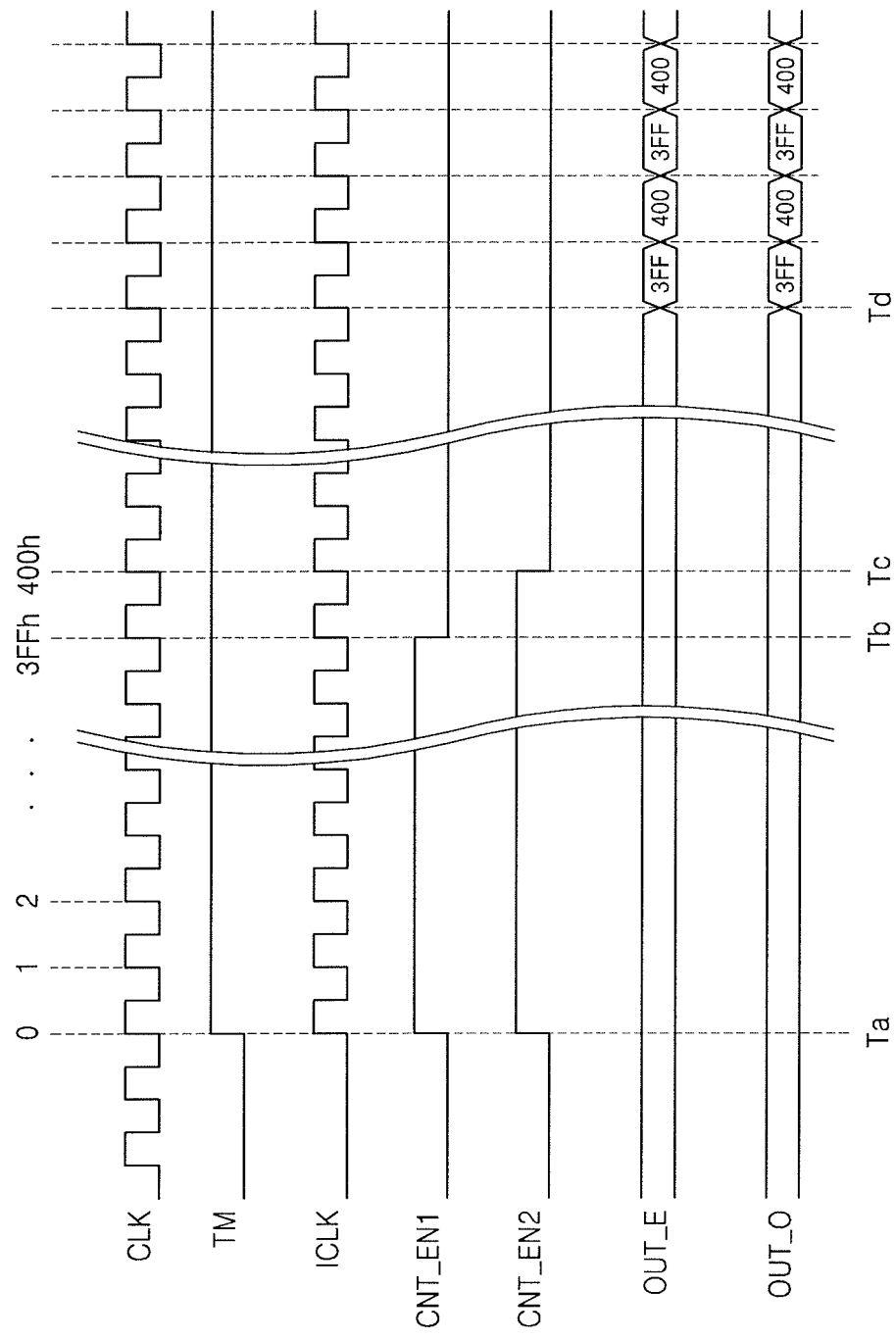

FIGS. 8A and 8B illustrate another embodiment for explaining a method for testing the counters in FIG. 2. FIG. 8A explains a method for testing the first through fourth counters CNT0 through CNT3 according to the count clock signal ICLK that are continuously provided based on first and second count enable signals CNT_EN1 and CNT_ENT2 of intervals corresponding to the first and second test codes TCODE1 and TCODE2.

Referring to FIG. 8A, the clock controller 185 may generate the first count enable signal CNT_EN1 corresponding to the first test code TCODE1 of the first test pattern generator 182. The first test code TCODE1 may be provided as, for example, 3FFh. The first count enable signal CNT_EN1 may be provided as a signal that is activated to the logic high level H, for example, during an interval corresponding to the first test code TCODE1 of 3FFh.

The clock controller 185 may generate the second count enable signal CNT_EN2 corresponding to the second test code TCODE2 of the second test pattern generator 183. The second test code TCODE2 may be provided as, for example, 400h. The second count enable signal CNT_EN2 may be provided as a signal that is activated to the logic high level H, for example, during an interval corresponding to the second test code TCODE2 of 400h.

When it is assumed that two adjacent columns from among columns of the pixel array 110 are used as a pair, the clock controller 185 may provide the first count enable signal CNT_EN1 to the first and second counters CNT0 and CNT1 corresponding to the first column C0 (even column) and second column C1 (odd column) of a first pair, and may provide the second count enable signal CNT_EN2 to the third and fourth counters CNT2 and CNT3 corresponding to the third column C2 (even column) and the fourth column C3 (odd column) of a second pair. Also, the clock controller 185 may provide the count clock signal ICLK, that is generated to be the same as the clock signal CLK, to the first through fourth counters CNT0 through CNT3.

Each of the first and second counters CNT0 and CNT1 may count a logic high interval of the first count enable signal CNT_EN1 according to the count clock signal ICLK. When a counting operation based on the first count enable signal CNT_EN1 is normally performed, each of the first and second counters CNT0 and CNT1 may output a counting value that is the same as the first test code TCODE1.

Each of the third and fourth counters CNT2 and CNT3 may count a logic high interval of the second count enable signal CNT_EN2 according to the count clock signal ICLK. When a counting operation based on the second count enable signal CNT_EN2 is normally performed, each of the third and fourth counters CNT2 and CNT3 may output a counting value that is the same as the second test code TCODE2.

Counting values of the first through fourth counters CNT0 through CNT3 are stored in the column memory MEM MEMS and are sequentially output through the sense amplifier 153.

The sense amplifier 153 sequentially outputs counting values of the first and third counters CNT0 and CNT2 (even counters) from among the first through fourth counters CNT0 through CNT3 through the first output line OUT_E and sequentially outputs counting values of the second and fourth counters CNT1 and CNT3 (odd counters) through the second output line OUT_O.

Referring to FIG. 8B, the clock signal CLK may be provided to the clock controller 185.

At time Ta, the clock controller 185 may generate the count clock signal ICLK that is the same as the clock signal CLK based on the test mode signal TM.

From time Ta to time Tb, the clock controller 185 may generate the first count enable signal CNT_EN1 having a logic high interval corresponding to 3FFh that is the first test code TCODE1 and may provide the first count enable signal CNT_EN1 to the first and second counters CNT0 and CNT1. Each of the first and second counters CNT0 and CNT1 may perform a counting operation according to the count clock signal ICLK during the logic high interval of the first count enable signal CNT_EN1 and may output a counting value of 3FFh.

From time Ta to time Tc, the clock controller 185 may generate the second count enable signal CNT_EN2 having a logic high interval corresponding to 400h that is the second test code TCODE2 and may provide the second count enable signal CNT_EN2 to the third and fourth counters CNT2 and CNT3. Each of the third and fourth counters CNT2 and CNT3 may perform a counting operation according to the count clock signal ICLK during the logic high interval of the second count enable signal CNT_EN2 and may output a counting value of 400h.

From time Td, counting values of 3FFh and 400h of the first and third counters CNT0 and CNT2 may be output to the first output line OUT_E and counting values of 3FFh and 400h of the second and fourth counters CNT1 and CNT3 may be output to the second output line OUT_O.

At time Td, the counting values of 3FFh and 400h of the first and third counters CNT0 and CNT2 of the first output line OUT_E that are sequentially output may be compared by the comparison logic unit 186 in the order of the first test code TCODE1 and the second test code TCODE2. Also, the counting values of 3FFh and 400h of the second and fourth counters CNT1 and CNT3 of the second output line OUT_O that are sequentially output may be compared by the comparison logic unit 186 in the order of first test code TCODE1 and second test code TCODE2.

The comparison logic unit 186 may output the logic high level H indicating a counting operation pass to the first test terminal when the counting values of the first and third counters CNT0 and CNT2 of the first output line OUT_E and the first and second test codes TCODE1 and TCODE2 are the same. The comparison logic unit 186 may output the logic low level L indicating a counting operation fail when the counting values of the first and third counters CNT0 and CNT2 of the first output line OUT_E and the first and second test codes TCODE1 and TCODE2 are not the same.

Also, the comparison logic unit 186 may output the logic high level H indicating a counting operation pass to the second test terminal when the counting values of the second and fourth counters CNT1 and CNT3 of the second output line OUT 0 and the first and second test codes TCODE1 and TCODE2 are the same. The comparison logic unit 186 may output the logic low level L indicating a counting operation fail when the counting values of the second and fourth counters CNT1 and CNT3 of the second output line OUT_O and the first and second test codes TCODE1 and TCODE2 are not the same.

Next, the logic levels of the first and second test terminals may be directly checked to determine whether a counting operation of each of the first through fourth counters CNT0 through CNT3 passes or fails.

Figure 9A:
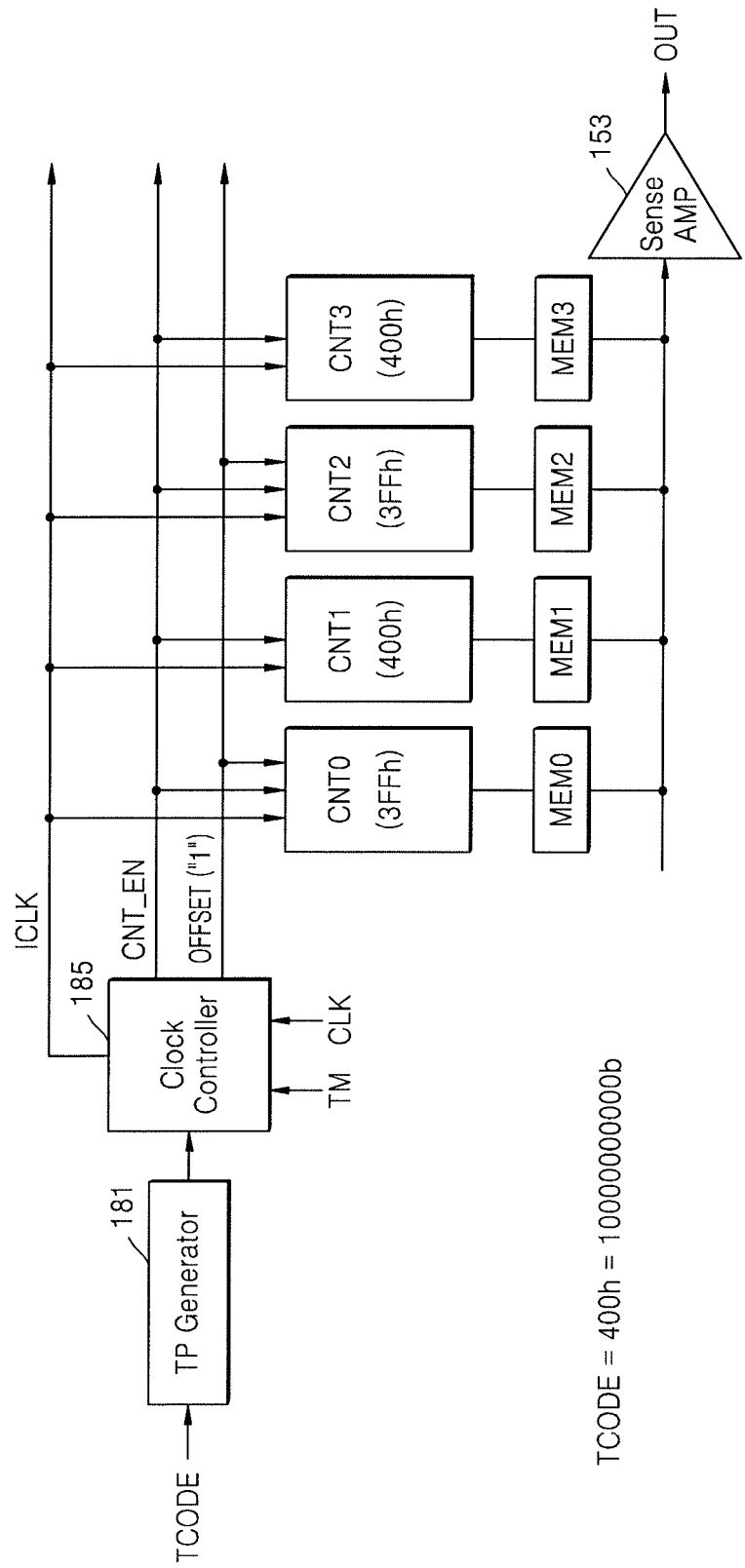
FIGS. 9A and 9B illustrate another embodiment of a method for testing counters.
Figure 9B:
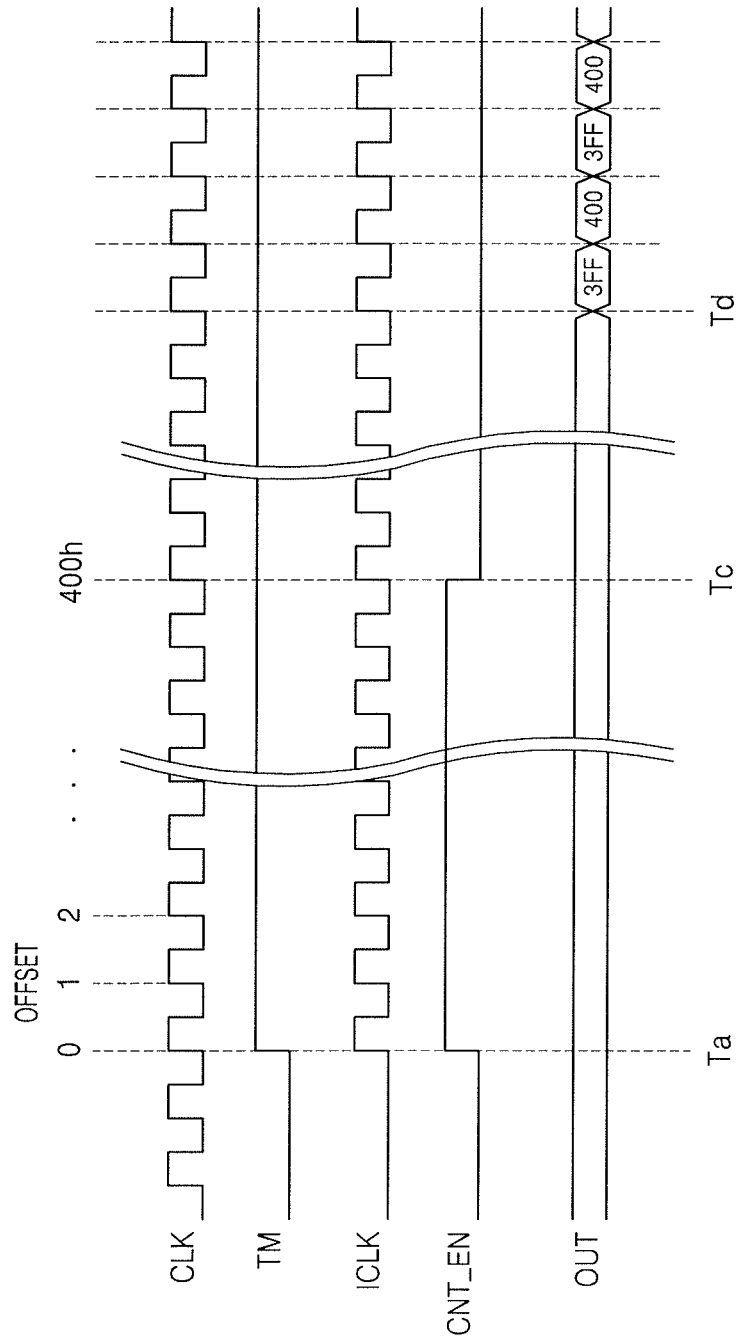

FIGS. 9A and 9B illustrate another embodiment for explaining a method for testing the counters in FIG. 2. FIG. 9A explains a method for testing the first through fourth counters CNT0 through CNT3 according to the count clock signal ICLK that are continuously provided based on the offset signal OFFSET and the count enable signal CNT_EN corresponding to the test code TCODE.

Referring to FIG. 9A, the count enable signal CNT_EN having an interval corresponding to the test code TCODE of the test pattern generator 181 is generated by the control controller 185 and is provided to the first through fourth counters CNT0 through CNT3. The clock controller 185 generates the count clock signal ICLK that is the same as the clock signal CLK and provides the count clock signal ICLK to the first through fourth counters CNT0 through CNT3.

Each of the first through fourth counters CNT0 through CNT3 performs a counting operation according to the count clock signal ICLK based on the count enable signal CNT_EN. In this case, initial values of the first and third counters CNT0 and CNT2 are set to the offset signal OFFSET, for example, 1, from the clock controller 185.

Each of the first and third counters CNT0 and CNT2 that are even counters may perform a counting operation based on the count clock signal ICLK beginning from the offset signal OFFSET of 1. Each of the second and fourth counters CNT1 and CNT3 that are odd counters may perform a counting operation based on the count clock signal ICLK beginning from an initial value of 0. When a counting operation is normally performed, each of the first and third counters CNT0 and CNT2 may output a counting value of 3FFh that is the same as the test code TCODE-1, which is obtained after subtracting the offset signal OFFSET of 1 from the test code TCODE. When a counting operation is normally performed, each of the second and fourth counters CNT1 and CNT3 may output a counting value of 400h that is the same as the test code TCODE.

Counting values of the first through fourth counters CNT0 through CNT3 are stored in the column memory MEM_MEM3 and are sequentially output through the sense amplifier 153.

Referring to FIG. 9B, at time Ta, the clock controller 185 may generate the count clock signal ICLK that is the same as the clock signal CLK based on the test mode signal TM.

From time Ta to time Tc, the clock controller 185 may generate the count enable signal CNT_EN having a logic high interval corresponding to 400h that is the test code TCODE and may provide the count enable signal CNT_EN to the first through fourth counters CNT0 through CNT3. Each of the first and third counters CNT0 and CNT2 (even counters) to which the offset signal OFFSET is provided may perform a counting operation according to the count clock signal ICLK beginning from the offset signal OFFSET of 1 during the logic high interval of the count enable signal CNT_EN. A counting value of 3FFh may then be output. Each of the second and fourth counters CNT1 and CNT3 (odd counters) may perform a counting operation according to the count clock signal ICLK during the logic high interval of the count enable signal CNT_EN. A counting value of 400h may then be output.

From time Td, counting values of the first through fourth counters CNT0 through CNT3 are sequentially output to the output line OUT. Counting values of 3FFh, 400h, 3FFh, and 400h of the first through fourth counters CNT0 through CNT3 of the output line OUT may be compared by the comparison logic unit 186 in an order of the test code TCODE-1, the test code TCODE, the test code TCODE-1, and the test code TCODE.

The comparison logic unit 186 may output the logic high level H indicating a counting operation pass to the test terminal 187 when the counting values of the first through fourth counters CNT0 through CNT3 and the test codes TCODE-1 and TCODE are the same. The comparison logic unit 186 may output the logic low level L indicating a counting operation fail when the counting values of the first through fourth counters CNT0 through CNT3 and the test codes TCODE-1 and TCODE are not the same.

Next, the logic level of the test terminal 187 may be directly checked to determine whether a counting operation of each of the first through fourth counters CNT0 through CNT3 passes or fails.

Figure 10A:
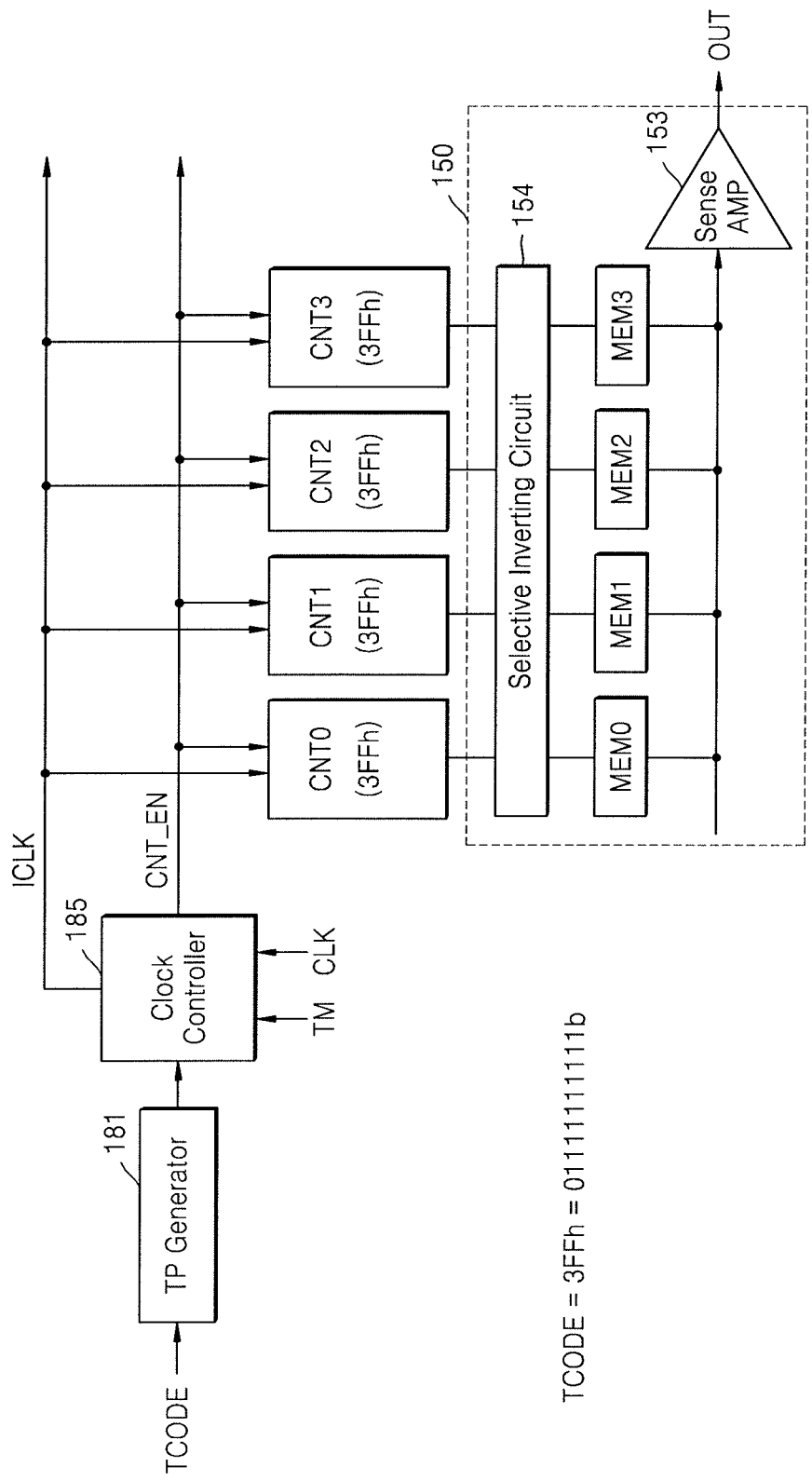
FIGS. 10A and 10B illustrate another embodiment of a method for testing counters.
Figure 10B:
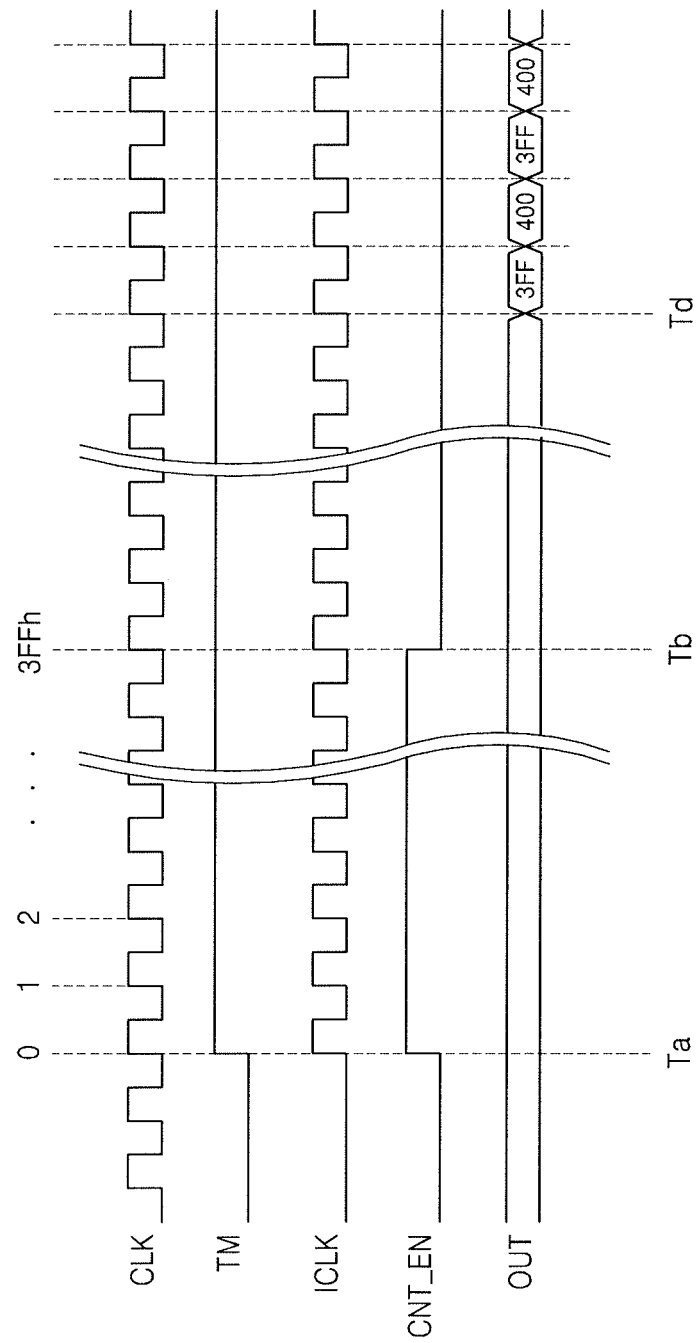

FIGS. 10A and 10B illustrate another embodiment for explaining a method for testing the counters in FIG. 2. FIG. 10A explains a method for testing the first through fourth counters CNT0 through CNT3 according to the count clock signal ICLK based on the count enable signal CNT_EN having an interval corresponding to the test code TCODE, using the selective inverting circuit 154 for inverting counting values of some counters.

Referring to FIG. 10A, the clock controller 185 generates the count clock signal ICLK that is continuously provided and the count enable signal CNT_EN having an interval corresponding to the test code TCODE of the test pattern generator 181. The count clock signal ICLK and the count enable signal CNT_EN are provided to the first through fourth counters CNT0 through CNT3. The test code TCODE may be provided as, for example, 3FFh that is a hexa code.

Each of the first through fourth counters CNT0 through CNT3 performs a counting operation according to the count clock signal ICLK during the logic high interval of the count enable signal CNT_EN. When a counting operation is normally performed, each of the first through fourth counters CNT0 through CNT3 may output a counting value of 3FFh that is the same as the test code TCODE.

The selective inverting circuit 154 may selectively invert counting values of the first through fourth counters CNT0 through CNT3. For example, the selective inverting circuit 154 may invert counting values of the second and fourth counters CNT1 and CNT3 (odd counters) from among the first through fourth counters CNT0 through CNT3. The counting values of 3FFh of the second and fourth counters CNT1 and CNT3 may be inverted by the selective inverting circuit 154 and may be output as 400h that is the inverted test code /TCODE. Counting values of the first and third counters CNT0 and CNT2 may be output as 3FFh.

Counting values of the first through fourth counters CNT0 through CNT3 are stored in the column memory MEM_MEM3 in the output buffer 150 and are sequentially output through the sense amplifier 153.

Referring to FIG. 10B, at time Ta, the clock controller 185 may generate the count clock signal ICLK that is the same as the clock signal CLK based on the test mode signal TM.

From time Ta to time Tb, the clock controller 185 may generate the count enable signal CNT_EN having a logic high interval corresponding to 3FFh that is the test code TCODE. The count enable signal CNT_EN may be provided to the first through fourth counters CNT0 through CNT3. Each of the first through fourth counters CNT0 through CNT3 may perform a counting operation based on the count clock signal ICLK during the logic high interval of the count enable signal CNT_EN and may output a counting value of 3FFh. Next, counting values of the second and fourth counters CNT1 and CNT3, that are odd counters, may be inverted by the selective inverting circuit 154 and an inverted counting value of 400h may be output.

From time Td, counting values of the first through fourth counters CNT0 through CNT3 are sequentially output to the output line OUT. Counting values of 3FFh, 400h, 3FFh, and 400h of the first through fourth counters CNT0 through CNT3 of the output line OUT may be compared by the comparison logic unit 186 in the order of the test code TCODE, the inverted test code /TCODE, the test code TCODE, and the inverted test code /TCODE.

The comparison logic unit 186 may output the logic high level H indicating a counting operation pass to the test terminal 187 when the counting values of the first through fourth counters CNT0 through CNT3 and the test codes TCODE and /TCODE are the same. The comparison logic unit 186 may output the logic low level L indicating a counting operation fail when the counting values of the first through fourth counters CNT0 through CNT3 and the test codes TCODE and /TCODE are not the same.

Next, the logic level of the test terminal 187 may be directly checked to determine whether a counting operation of each of the first through fourth counters CNT0 through CNT3 passes or fails.

Thus, a method for testing counters according to one or more embodiments may monitor, through a test terminal, results of a counting operation (performed according to a count clock signal corresponding to a test code) and a counting operation (performed according to the count clock signal based on a count enable signal having an interval corresponding to the test code). Accordingly, the clearness of image data generated by the image sensor may be further improved.

Figure 11:
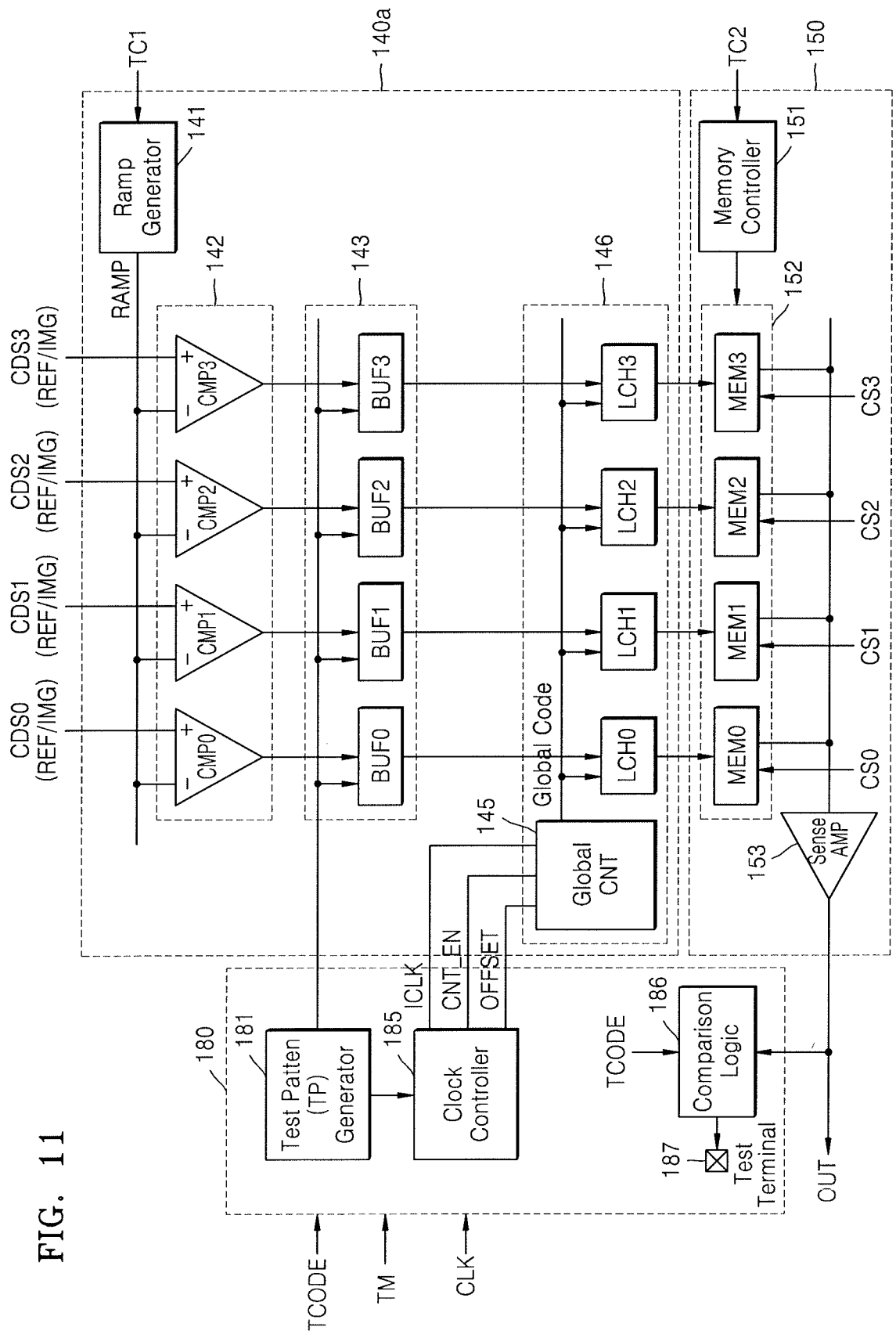
FIGS. 11 and 12 illustrate an ADC corresponding to a method of testing counters according to an embodiment.
Figure 12:
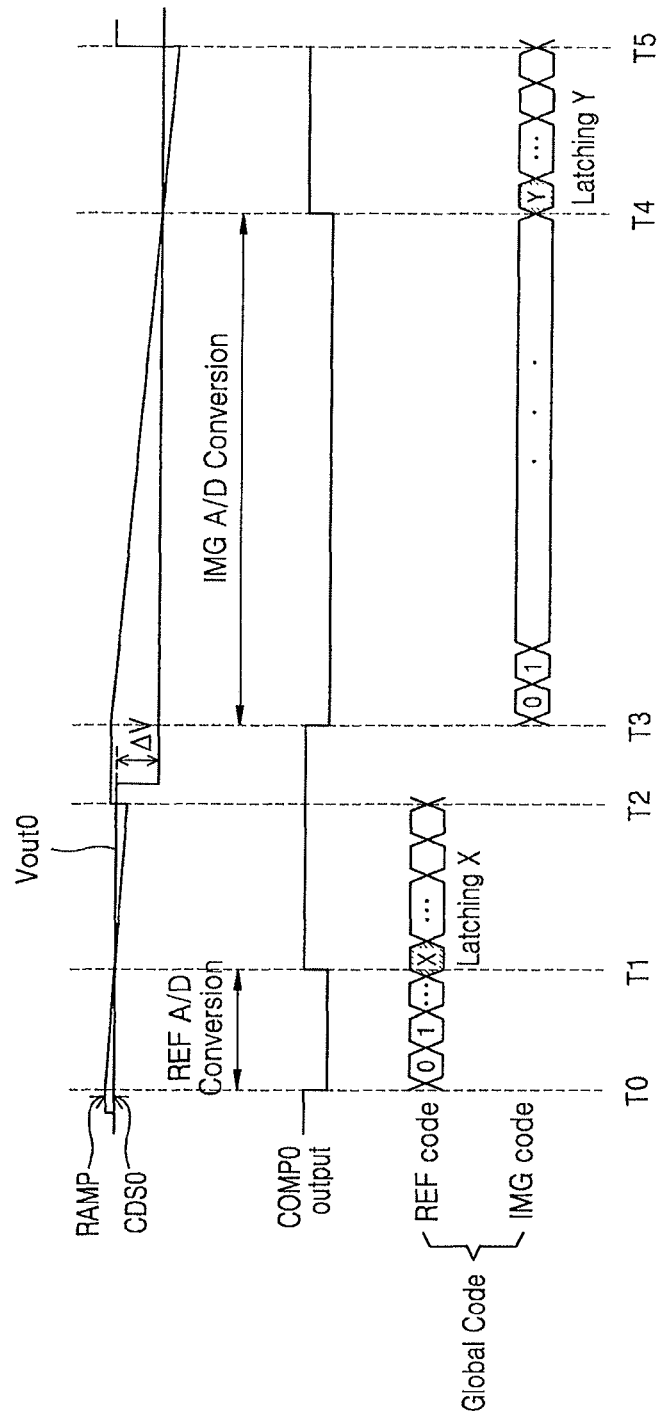

FIGS. 11 and 12 illustrate another embodiment of an ADC 140a to which a method for testing counters may be applied. Referring to FIG. 11, the ADC 140a includes the ramp signal generator 141, the comparison unit 142, the buffer unit 143, a global counter 145, and a latch unit 146. The ADC 140a may be connected to the output buffer 150 including the memory controller 151, the column memory unit 152, and the sense amplifier 153. Also, the ADC 140a may be connected to the test circuit 180 including the test pattern generator 181, the clock controller 185, the comparison logic unit 186, and the test terminal 187. The ramp signal generator 141, the comparison unit 142, the buffer unit 143, the output buffer 150, and the test circuit 180 are the same and perform the same functions as in FIG. 2.

The global counter 145 is shared by columns, unlike the first through fourth counters CNT0 through CNT3 of FIG. 2 that are arranged respectively for the columns of the pixel array 110. The global counter 145 is provided in order to reduce or minimize the number of counters in the ADC 140a. The global counter 145 may generate a global code based on a control signal provided from the timing controller 170. The global code may be provided as a binary code that is counted upwardly or downwardly to specific bits, for example, 11 bits.

The global counter 155 may generate a global code value (X, Y) that is counted upwardly from a point at which a level of the ramp signal RAMP begins to decrease. The global code value (X, Y) may be obtained simultaneously for all of the columns. The global code is provided to first through fourth latches LCH0 through LCH3 of the latch unit 146.

Each of the first through fourth latches LCH0 through LCH3 of the latch unit 146 latches the reference code X corresponding to the reference signal REF and the image code Y corresponding to the image signal IMG of the correlated double sampling signal REF/IMG based on a comparison result of each of the first through fourth comparators CMP0 through CMP3. Next, the ADC 140a may generate image data with no noise by subtracting the reference code X from the image code Y corresponding to each of the columns using a calculator. The image data is output through the output buffer 150.

The global counter 145 may be tested by the test circuit 180. The test circuit 180 may test a counting operation of the block counter 145 (performed according to a count clock signal corresponding to a test code) and a counting operation performed according to the count clock signal based on a count enable signal having an interval corresponding to the test code. A test result of the global counter 145 may be output through a test terminal.

Figure 13:
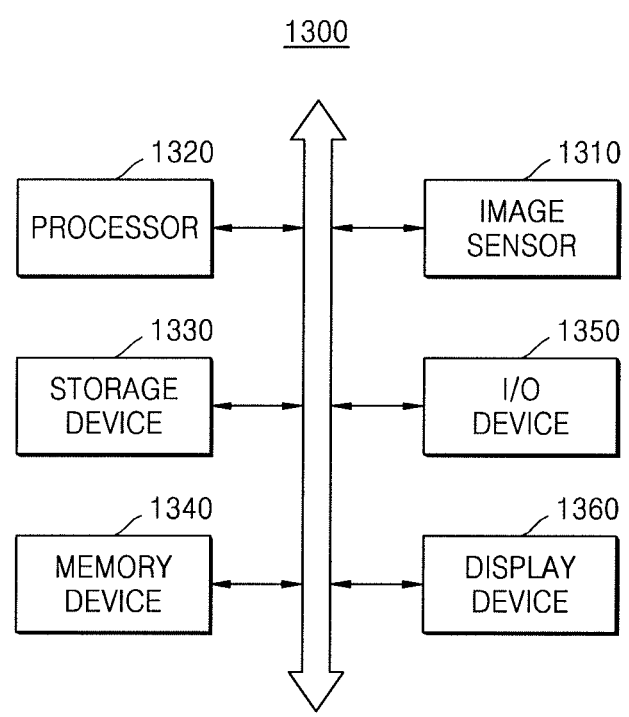
FIG. 13 illustrates an embodiment of a computing system including an image sensor.

FIG. 13 illustrates an embodiment of a computing system 1300 including an image sensor 1310. Referring to FIG. 13, the computing system 1300 includes the image sensor 1310, a processor 1320, a storage device 1330, a memory device 1340, an input/output device 1350, and a display device 1360. The computing system 1300 may include ports that communicate with a video card, a sound card, a memory card, a universal serial bus (USB) device, or other electronic devices.

The image sensor 1310 generates image data corresponding to incident light, and the display device 1360 displays the image data. The storage device 1330 stores the image data. The processor 1320 controls operations of the image sensor 1310, the display device 1360, and the storage device 1330.

The processor 1320 may perform specific calculations or tasks. According to an embodiment, the processor 1320 may be connected to and communicate with the storage device 1330, the memory device 1340, and the input/output device 1350 via an address bus, a control bus, and a data bus. According to an embodiment, the processor 1320 may also be connected to an expansion bus such as a peripheral component interconnect (PCI) bus. Examples of the storage device 1330 may include a flash memory device, a solid-state drive (SSD), a hard disk drive (HDD), a compact disk read-only memory (CD-ROM), and various non-volatile memory devices.

The memory device 1340 may store data for operating the computing system 1300. Examples of the memory device 1340 may include a volatile memory device such as a dynamic random-access memory (DRAM) or a static random-access memory (SRAM) and a non-volatile memory device such as an erasable programmable read-only memory (EPROM), an electrically erasable programmable read-only memory (EEPROM), or a flash memory device.

The input/output device 1350 may include an input unit such as a keyboard, a keypad, or a mouse and an output unit such as a printer or a display.

The image sensor 1310 may be the image sensor 100 of FIG. 1. The image sensor 100 of FIG. 1 may include the first through fourth counters CNT0 through CNT3 in the ADC 140 of FIG. 2 and the test circuit 180 that tests the global counter 144 of FIG. 11. The image sensor 1310 may test a counting operation of each of the first through fourth counters NCT0 through CNT3 in the ADC 140 or the global counter 144 according to a count clock signal corresponding to a test code and a counting operation according to the count clock signal based on a count enable signal having an interval corresponding to the test code, by using the test circuit 180.

The image sensor 1310 may be mounted using any of various packages. For example, at least some elements of the image sensor 1310 may be mounted using a package-on-package (POP), ball grid array (BGA), chip scale package (CSP), plastic leaded chip carrier (PLCC), plastic dual in-line package (PDIP), die in waffle pack, die in wafer form, chip-on-board (COB). ceramic dual in-line package (CERDIP), metric quad flat package (MQFP), thin quad flatpack (TQFP), small outline (SOIC), shrink small outline package (SSOP), thin small outline (TSOP), system in package (SIP), multi chip package (MCP), wafer-level fabricated package (WFP), or wafer-level processed stack package (WSP).

According to an embodiment, the image sensor 1310 may be integrated into one chip along with the processor 1320 or the image sensor 1310 and the processor 1320 may be integrated into different chips.

The computing system 1300 may be any of various computing systems using the image sensor 1310. Examples of the computing system 1300 include a digital camera, a mobile phone, a personal digital assistant (PDA), a portable multimedia player (PMP), and a smart phone.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

The controllers, comparators, calculators, counters, test circuits, and other processing features of the embodiments described herein may be implemented in logic which, for example, may include hardware, software, or both. When implemented at least partially in hardware, the controllers, comparators, calculators, counters, test circuits, and other processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, comparators, calculators, counters, test circuits, and other processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
   a pixel array including a plurality of pixels arranged in rows and columns, each of the pixels to generate an analog signal based on incident light;
   an analog-to-digital converter (ADC) to convert the analog signal to a digital signal using a counter; and
   a test logic to receive a test code in a test mode, generate a count clock signal based on the test code, supply the count clock signal to the counter, test a counting operation of the counter according to the count clock signal, and externally output a test result of the counter through a test terminal.

2. The image sensor as claimed in claim 1, wherein the test logic includes:
   a test pattern generator to receive the test code;
   a clock generator to receive a clock signal, generate the count clock signal corresponding to the test code from the clock signal, and cause the counter to output an expected counting value by performing a counting operation according to the count clock signal; and
   a comparison logic to compare the expected counting value of the counter with the test code and output a comparison result.

3. The image sensor as claimed in claim 2, wherein the clock generator is to generate an offset signal for setting an initial value of the counter and apply the offset signal to the counter.

4. The image sensor as claimed in claim 2, further comprising:
   a selective inverter to invert the expected counting value of the counter and output an inverted expected counting value.

5. The image sensor as claimed in claim 1, wherein the test logic includes:
   a test pattern generator to receive the test code;
   a clock controller to receive a clock signal, generate a count clock signal according to the clock signal, generate a count enable signal having an interval corresponding to the test code, and cause the counter to output an expected counting value by performing a counting operation according to the count clock signal during the interval of the count enable signal; and
   a comparison logic to compare the expected counting value of the counter with the test code and output a comparison result.

6. The image sensor as claimed in claim 5, wherein the clock controller is to generate an offset signal for setting an initial value of the counter and apply the offset signal to the counter.

7. The image sensor as claimed in claim 5, further comprising:
   a selective inverter to invert the expected counting value of the counter and output an inverted expected counting value.

8. A method for testing an image sensor, which converts an analog signal generated by each of a plurality of pixels into a digital signal using a counter, the test method comprising:
   receiving a test code based on a test mode signal;
   generating a count clock signal based on the test code;
   supplying the count clock signal to the counter;
   performing a counting operation of the counter according to the count clock signal; and
   comparing an expected counting value according to the counting operation of the counter with the test code and externally outputting a comparison result through a test terminal.

9. The method as claimed in claim 8, wherein performing the counting operation of the counter according to the count clock signal includes:
causing the counter corresponding to even columns from among columns of the pixels to output the expected counting value according to a first count clock signal corresponding to a first test code; and
causing the counter corresponding to odd columns from among the columns of the pixels to output the expected counting value according to a second count clock signal corresponding to a second test code that is different from the first test code.

10. The method as claimed in claim 8, wherein performing the counting operation of the counter according to the count clock signal includes:
causing the counter corresponding to each of even columns or odd columns from among columns of the pixels to output the expected counting value according to the count clock signal corresponding to the test code beginning from an initial value set by an offset signal.

11. The method as claimed in claim 8, wherein performing the counting operation of the counter according to the count clock signal includes:
causing the counter corresponding to each of even columns or odd columns from among columns of the pixels to selectively invert the expected counting value obtained by performing the counting operation based on the count clock signal corresponding to the test code.

12. The method as claimed in claim 8, wherein performing the counting operation of the counter according to the count clock signal includes:
causing the counter corresponding to even columns from among columns of the pixels to output the expected counting value according to the count clock signal based on a first count enable signal having an interval corresponding to a first test code; and
causing the counter corresponding to odd columns from among the columns of the pixels to output the expected counting value according to the count clock signal based on a second count enable signal having an interval corresponding to a second test code that is different from the first test code.

13. The method as claimed in claim 8, wherein performing the counting operation of the counter according to the count clock signal includes:
when adjacent columns from among columns of the pixels are in pairs, causing the counter corresponding to each of an even column and an odd column of a first pair to output the expected counting value according to the count clock signal based on a first count enable signal having an interval corresponding to a first test code; and
causing the counter corresponding to each of an even column and an odd column of a second pair to output the expected counting value according to the count clock signal based on a second count enable signal having an interval corresponding to a second test code that is different from the first test code.

14. The method as claimed in claim 8, wherein performing the counting operation of the counter according to the count clock signal includes:
causing the counter corresponding to each of even columns or odd columns from among columns of the pixels to output the expected counting value according to the count clock signal based on a count enable signal having an interval corresponding to the test code beginning from an initial value set by an offset signal.

15. The method as claimed in claim 8, wherein performing the counting operation of the counter according to the count clock signal includes:
causing the counter corresponding to each of even columns or odd columns from among columns of the pixels to selectively invert the expected counting value obtained by performing the counting operation according to the count clock signal based on a count enable signal having an interval corresponding to the test code.

16. An apparatus, comprising:
a converter to convert an analog signal to a digital signal using a counter; and
a test logic to receive a test code, generate a count clock signal based on the test code, supply the count clock signal to the counter, test a counting operation of the counter based on the count clock signal, and output a test result of the counting operation, wherein the analog signal is output from a pixel of an image sensor.

17. The apparatus as claimed in claim 16, wherein the test logic is to operate when the image sensor is in test mode.

18. The apparatus as claimed in claim 16, wherein the test logic is to:
compare a predicted counting value with the test code, and
generate the test result based on the comparison, wherein the predicted counting value is to be obtained based on the counting operation.

19. The apparatus as claimed in claim 16, wherein the test logic is to:
generate the count clock signal based a received clock signal,
generate the count enable signal to have an interval corresponding to the test code,
cause the counter to output an expected counting value by performing a counting operation based on the count clock signal during the interval of the count enable signal,
compare the expected counting value of the counter with the test code, and
outputs the test result based on a comparison result.

20. The apparatus as claimed in claim 16, the test logic includes a test pattern generator.

* * * * *